US012051534B2

(12) United States Patent
Li et al.

(10) Patent No.: US 12,051,534 B2
(45) Date of Patent: Jul. 30, 2024

(54) THREE DIMENSIONAL (3D) VERTICAL SPIRAL INDUCTOR AND TRANSFORMER

(71) Applicant: QUALCOMM Incorporated, San Diego, CA (US)

(72) Inventors: Xia Li, San Diego, CA (US); Bin Yang, San Diego, CA (US); Haining Yang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 559 days.

(21) Appl. No.: 17/226,744

(22) Filed: Apr. 9, 2021

(65) Prior Publication Data

US 2022/0328237 A1  Oct. 13, 2022

(51) Int. Cl.
*H01F 27/29* (2006.01)
*H01F 17/00* (2006.01)
*H01F 41/04* (2006.01)
*H01L 49/02* (2006.01)

(52) U.S. Cl.
CPC ......... *H01F 27/29* (2013.01); *H01F 17/0013* (2013.01); *H01F 41/041* (2013.01); *H01L 28/10* (2013.01); *H01F 2017/0073* (2013.01)

(58) Field of Classification Search
CPC .... H01F 27/29; H01F 17/0013; H01F 41/041; H01L 28/10
See application file for complete search history.

(56) References Cited

U.S. PATENT DOCUMENTS

| 10,032,711 | B2 * | 7/2018 | Basker | H01L 28/60 |
| 10,553,339 | B1 * | 2/2020 | Xiong | H01F 27/306 |
| 2002/0179955 | A1 * | 12/2002 | Morimoto | H01L 21/76831 |
| | | | | 257/E21.582 |
| 2003/0003603 | A1 * | 1/2003 | Chaudhry | H01L 23/5227 |
| | | | | 257/E21.022 |
| 2004/0263308 | A1 * | 12/2004 | Yu | H01F 17/0033 |
| | | | | 336/200 |
| 2005/0003562 | A1 | 1/2005 | Bhatt et al. | |
| 2005/0024176 | A1 * | 2/2005 | Wang | H01L 23/5227 |
| | | | | 336/200 |
| 2006/0022787 | A1 * | 2/2006 | Brennan | H01F 17/0006 |
| | | | | 336/200 |

(Continued)

OTHER PUBLICATIONS

International Search Report and Written Opinion—PCT/US2022/070566—ISA/EPO—May 27, 2022.

*Primary Examiner* — Nathan W Ha
(74) *Attorney, Agent, or Firm* — Muncy, Geissler, Olds & Lowe

(57) ABSTRACT

Disclosed is apparatus including a vertical spiral inductor. The vertical spiral inductor may include a plurality of dielectric layers formed on a substrate, a plurality of conductive layers, each of the plurality of conductive layers disposed on each of the plurality of dielectric layers, a plurality of insulating layers, each of the plurality of insulating layers disposed on each of the plurality of conductive layers, wherein each of the plurality of insulating layers separates each of the plurality of dielectric layers. A first spiral coil is arranged in a first plane perpendicular to the substrate, where the first spiral coil is formed of first portions of the plurality of conductive layers and a first set of vias of a plurality of vias, configured to connect the first portions of the plurality of conductive layers.

15 Claims, 17 Drawing Sheets

(56) References Cited

U.S. PATENT DOCUMENTS

| | | | |
|---|---|---|---|
| 2007/0155152 A1* | 7/2007 | Kang, II | H01L 23/5227 438/597 |
| 2007/0254448 A1* | 11/2007 | Bhatt | H01L 28/10 257/E21.022 |
| 2008/0204183 A1* | 8/2008 | Loza | H01F 17/0013 336/200 |
| 2008/0290459 A1* | 11/2008 | Barth | H01L 28/75 257/532 |
| 2009/0002115 A1* | 1/2009 | Brennan | H01L 23/5227 336/200 |
| 2009/0160020 A1* | 6/2009 | Barth | G06F 30/39 257/532 |
| 2009/0230507 A1* | 9/2009 | Riess | H01L 23/5223 257/532 |
| 2010/0330771 A1* | 12/2010 | Barth | H01L 27/0611 438/387 |
| 2011/0248811 A1* | 10/2011 | Kireev | H01L 23/5227 336/200 |
| 2012/0091560 A1* | 4/2012 | Riess | H01L 23/5223 257/532 |
| 2012/0268229 A1* | 10/2012 | Yen | H01F 17/0013 336/200 |
| 2014/0203401 A1* | 7/2014 | Li | H01L 28/91 257/532 |
| 2014/0203404 A1* | 7/2014 | Choi | H01L 23/5223 438/399 |
| 2014/0375408 A1* | 12/2014 | Yen | H01F 17/0013 336/200 |
| 2015/0102461 A1* | 4/2015 | Lee | H10B 12/09 257/532 |
| 2015/0340427 A1* | 11/2015 | Nagai | H01L 28/86 257/532 |
| 2016/0133560 A1* | 5/2016 | Landgraf | H01L 28/91 257/532 |
| 2018/0025974 A1* | 1/2018 | Basker | H01L 21/7682 257/534 |
| 2018/0233446 A1* | 8/2018 | Basker | H01L 21/7682 |
| 2019/0228898 A1* | 7/2019 | Yen | H01L 23/5227 |
| 2019/0305077 A1* | 10/2019 | Feng | H01L 23/5223 |
| 2019/0311986 A1* | 10/2019 | Amanapu | H01L 21/76847 |
| 2019/0371518 A1* | 12/2019 | Viala | H01F 27/2804 |
| 2019/0378643 A1* | 12/2019 | Zhou | H01F 27/2823 |
| 2020/0052583 A1* | 2/2020 | Shekhar | H02M 3/158 |
| 2020/0066438 A1* | 2/2020 | Lee | H01L 28/10 |
| 2020/0118921 A1* | 4/2020 | Cheng | H01G 4/30 |
| 2020/0258672 A1* | 8/2020 | Yen | H01F 27/2804 |
| 2021/0167482 A1* | 6/2021 | Ogata | H03H 7/075 |
| 2023/0154843 A1* | 5/2023 | Chen | H01L 21/76877 257/532 |

* cited by examiner

THREE DIMENSIONAL (3D) VERTICAL SPIRAL INDUCTOR AND TRANSFORMER

FIELD OF DISCLOSURE

This disclosure generally relates to semiconductor devices, and more specifically, but not exclusively, to 3D spiral inductors and transformer devices including these spiral inductors and manufacturing methods thereof.

BACKGROUND

Integrated circuit and packaging technologies has achieved great strides in advancing computing power and reducing power consumption, through the miniaturization and scaling reduction of active components. The present disclosure generally relates to inductor structures possessing high quality factors (Q), having a planar spiral inductor configuration, and a device package structure that can accommodate the spiral inductor. These spiral inductors may also be coupled in a manner via respective input and output taps to form it into a transformer configuration.

An inductor is an impedance device, and they can also include transformers and other inductive reactors. Inductors are used in many important circuit applications, such as filters, power conditioning and impedance matching circuits for example.

Inductor structures are used in semiconductor devices and these semiconductor devices are typically fabricated from a core and a semiconductor substrate, over which various patterns and geometries of conductor layers are formed, connected, and separated by dielectric layers, metal layers and other insulating layers.

Various inductors are shaped as coils and these coils are then wrapped on various core materials such as ferrites. The core is typically shaped as a rod, cylinder, or toroid. Typically, the more windings the coil has, the higher the inductance value it possesses.

Accordingly, there is a need for devices and methods that overcome the deficiencies of the conventional approaches as provided and discussed in this disclosure.

SUMMARY

The following presents a simplified summary relating to one or more aspects and/or examples associated with the apparatus and methods disclosed herein. As such, the following summary should not be considered an extensive overview relating to all contemplated aspects and/or examples, nor should the following summary be regarded to identify key or critical elements relating to all contemplated aspects and/or examples or to delineate the scope associated with any particular aspect and/or example. Accordingly, the following summary has the sole purpose to present certain concepts relating to one or more aspects and/or examples relating to the apparatus and methods disclosed herein in a simplified form to precede the detailed description presented below.

In accordance with the various aspects disclosed herein, at least one aspect of the includes an apparatus having a spiral inductor comprising a plurality of dielectric layers formed on a substrate; a plurality of conductive layers, each of the plurality of conductive layers disposed on each of the plurality of dielectric layers; a plurality of insulating layers, each of the plurality of insulating layers disposed on each of the plurality of conductive layers and configured to separate each of the plurality of dielectric layers; a plurality of vias; and a first spiral coil arranged in a first plane perpendicular to the substrate, where the first spiral coil is formed of first portions of the plurality of conductive layers and a first set of vias of the plurality of vias, configured to connect the first portions of the plurality of conductive layers.

In accordance with the various aspects disclosed herein, at least one aspect includes a method for fabricating a spiral inductor, the method may include: depositing a plurality of dielectric layers on a substrate; depositing a plurality of conductive layers, each of the plurality of conductive layers disposed on each of the plurality of dielectric layers; depositing a plurality of insulating layers, each of the plurality of insulating layers disposed on each of the plurality of conductive layers, wherein each of the plurality of insulating layers separates each of the plurality of dielectric layers; forming a plurality of vias; and forming a first spiral coil in a first plane perpendicular to the substrate, wherein the first spiral coil is formed of first portions of the plurality of conductive layers and a first set of vias of the plurality of vias, configured to connect the first portions of the plurality of conductive layers Other features and advantages associated with the apparatus and methods disclosed herein will be apparent to those skilled in the art based on the accompanying drawings and detailed description.

BRIEF DESCRIPTION OF THE DRAWINGS

A more complete appreciation of the various aspects of the disclosure and many of the associated technical advantages will be readily understood by reference to the following detailed description when considered in connection with the accompanying drawings. These drawings are presented solely for illustration and not limitation of the disclosure.

Figure 1:
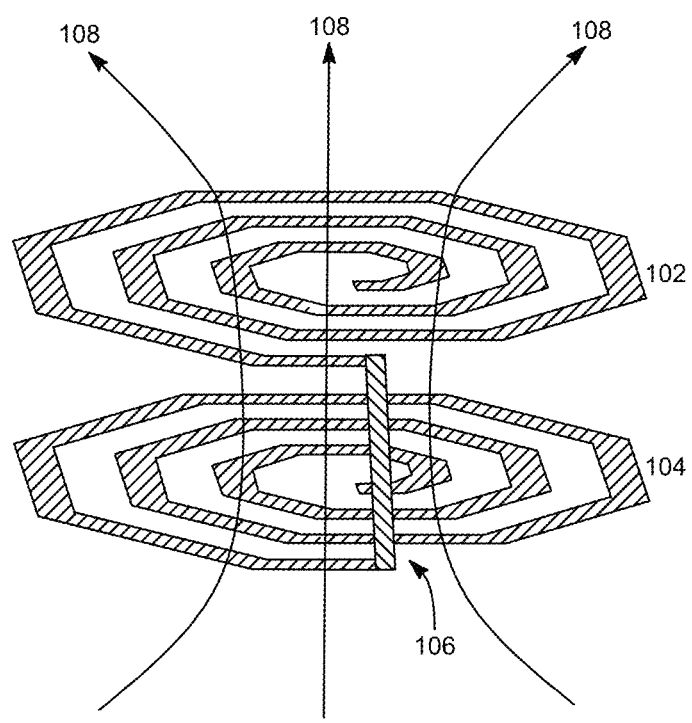
FIG. 1 illustrates a partial cross-sectional view of a conventional horizontally oriented planar spiral inductor.

In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

Aspects of the present disclosure are illustrated in the following description and related drawings directed to specific aspects. Alternate aspects or aspects may be devised without departing from the scope of the teachings herein. Additionally, well-known elements of the illustrative aspects herein may not be described in detail or may be omitted so as not to obscure the relevant details of the teachings in the present disclosure.

In certain described example implementations, instances are identified where various component structures and portions of operations can be taken from known, conventional techniques, and then arranged in accordance with one or more exemplary aspects. In such instances, internal details of the known, conventional component structures and/or portions of operations may be omitted to help avoid potential obfuscation of the concepts illustrated in the illustrative aspects disclosed herein.

The terminology used herein is for the purpose of describing particular aspects only and is not intended to be limiting. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Aspects of the present disclosure describe a spiral inductor and transformer structure used for high quality factor (Q) inductors and transformers. The structure includes a plurality of spiral traces supported by a plurality of respective substrates. These spiral structures have a spiral design implemented on a single plane, with the spiral containing one or more turns in the plane of the inductor.

The inductance value of an inductor is proportional to the metal length used to form the inductor. The inductance value can also be affected by many factors, such as the width of the metal forming the inductor turns, the space found in between the turns, the dimensions (e.g., diameter) of the metal conductor and the number of turns in the spiral. A spiral inductor of this type may have more or less loops or spiral windings, depending upon the desired circuit application and its associated inductance requirements.

The spiral traces are semiconductor representations or implementations of what is also known as inductors, coils, or windings in the related art.

For purposes of simplicity, the spiral inductor term will be used to cover both spiral inductors and transformers. A transformer is formed using the spiral inductors where the spiral inductors are magnetically coupled and are electrically connected using at least one input tap and at least one output tap selected for the specific transformer application desired.

FIG. 1 illustrates a conventional horizontal planar spiral inductor illustrating two spiral structures (102 and 104) in a planar configuration and in parallel with each other and electrically connected or coupled to each other (connection or coupling shown in 106). This conventional inductor configuration requires a bottom wafer substrate shield of polysilicon or some other suitable material (e.g., metal) to provide the necessary shielding to mitigate against the harmful effects of magnetic flux and currents (shielding not shown) to silicon substrate for eddy current loss.

The shielding is necessary to prevent any harmful effects transferring from the emanating inductor to sensitive electronic components or signal/electrical routing pathways located underneath the inductor. These harmful effects are shown by the energy flow and flux lines flowing through the spiral inductors (108). These harmful effects lead to a design constraint and requirement for establishing a keep out zone (KOZ) side and underneath the inductor structure to prevent this interference from occurring in the conventional configuration shown in FIG. 1.

In the conventional art, grill-like structures (similar to a Faraday cage) are sometimes used and provide a conventional shielding structure required with this horizontal spiral inductor configuration to prevent the electrical and magnetic flux fields which are generated from permeating throughout a substrate structure. We know from physics and device material characteristics that these electrical and magnetic flux fields may generate Eddy currents (also referred to as Foucault's currents). They are loops of electrical current induced within conductors by a changing, fluctuating or fluxing magnetic field in the conductor operating in accordance with Faraday's laws of inductions. Eddy currents typically flow in closed loops within conductors, as well as in planes perpendicular to the magnetic field.

These Eddy currents may cause undesirable types of interferences and degraded operational properties in the device. Therefore, various shielding structures are needed on the bottom and may also be needed on the top of the package (e.g. in the form of molding compounds) to mitigate the deleterious effects of these electrical and magnetic fields.

At least one technical advantage of various aspects of the present disclosure is a device which mitigates or prevents these harmful events from occurring and precludes the requirement for shielding and a KOZ, as used in the conventional designs.

Figure 2:
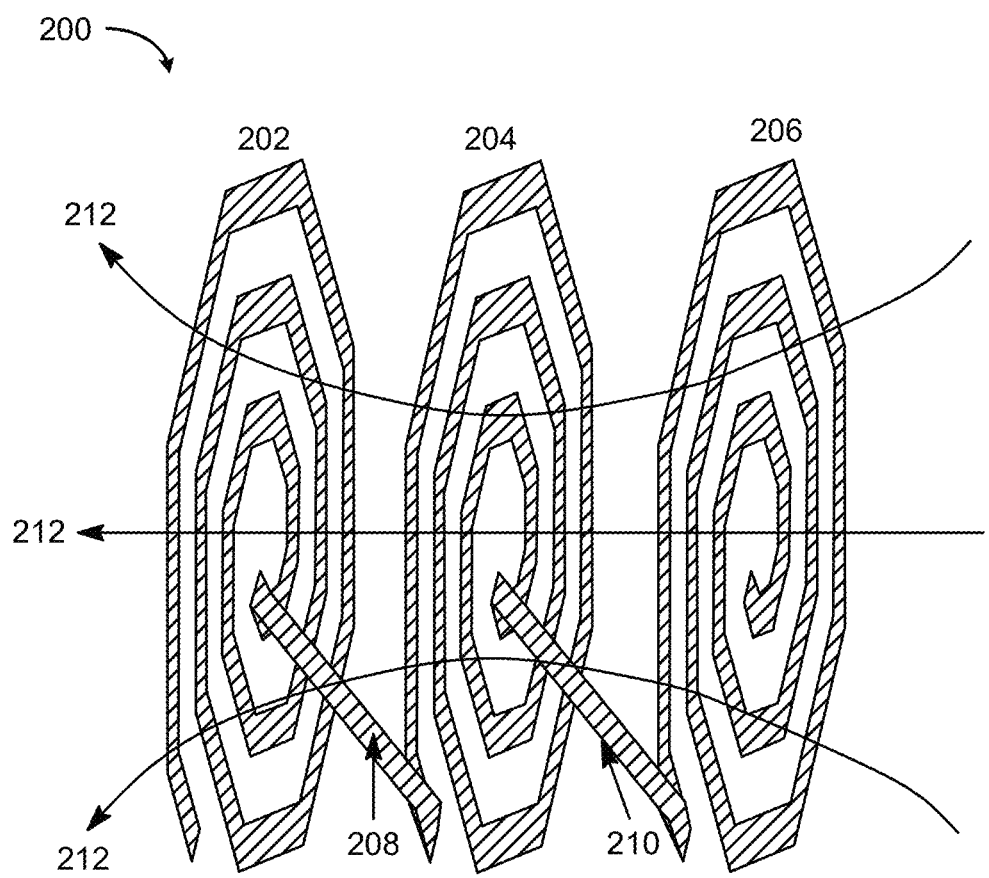
FIG. 2 illustrates a partial cross-sectional view of a vertically oriented 3D spiral inductor in accordance with at least one aspect of the disclosure.

FIG. 2 illustrates a vertically oriented 3D spiral inductor 200 configuration illustrating three spiral conductive structures (e.g., coil 202, coil 204 and coil 206) in parallel with each other and coupled to each other in series using conductors 208 and 210. Also shown in FIG. 2 are electrical flux lines 212 flowing through the three spiral conductive structures. The 3D spiral inductor 200 is positioned in a planar, vertical orientation. It will be appreciated that the various aspects disclosed are not limited to the illustrated configuration. For example, in some aspects coils 202, 204 and 206 could be coupled in parallel or in other aspects, coils 202, 204 and 206 could be configured to form a transformer or as part of a transformer.

According to the various aspects disclosed herein and discussed in the following, a back end of line (BEOL) process may include forming one or more intermetal dielectric (IMD) layers, which may have one or more metal layers (e.g., Mx, Mx-1, Mx-2, etc.) and one or more vias which are used to form the various coils, inductors and transformers discussed herein. In some aspects, the metal layers may be formed from any high conductive material, such as, copper (Cu), aluminum (AL), silver (Ag), gold (Au), Cobalt (Co), Ruthenium (Ru), Tungsten (W) or other conductive materials, alloys, or combinations thereof. In some aspects, the IMD layers may be formed of materials such as doped silicon dioxide (SiO$_2$), or its fluorine-doped, carbon-doped, and carbon-doped forms, as well as spin-on organic polymeric dielectrics such as polyimide (PI), polynorbornenes, benzocyclobutene (BCB), polytetrafluoroethylene (PTFE) and/or silicone based polymeric dielectrics.

Those skilled in the art will appreciate that the number of spiral trace layers and how densely the spirals are wound or coiled in the IMDs enables higher or lower inductance levels, depending upon the ultimate design parameters and inductance values used for a given circuit application.

Additionally, those skilled in the art will also appreciate that other geometric shapes for the spiral pattern shown in the FIG. 2 may also be used without departing from the spirit and scope of the present invention. For example, some other shapes that may be implemented include (but are not limited to) triangles, rectangles, squares, circles, ellipses, and other polygons of higher or lower order.

Figure 3:
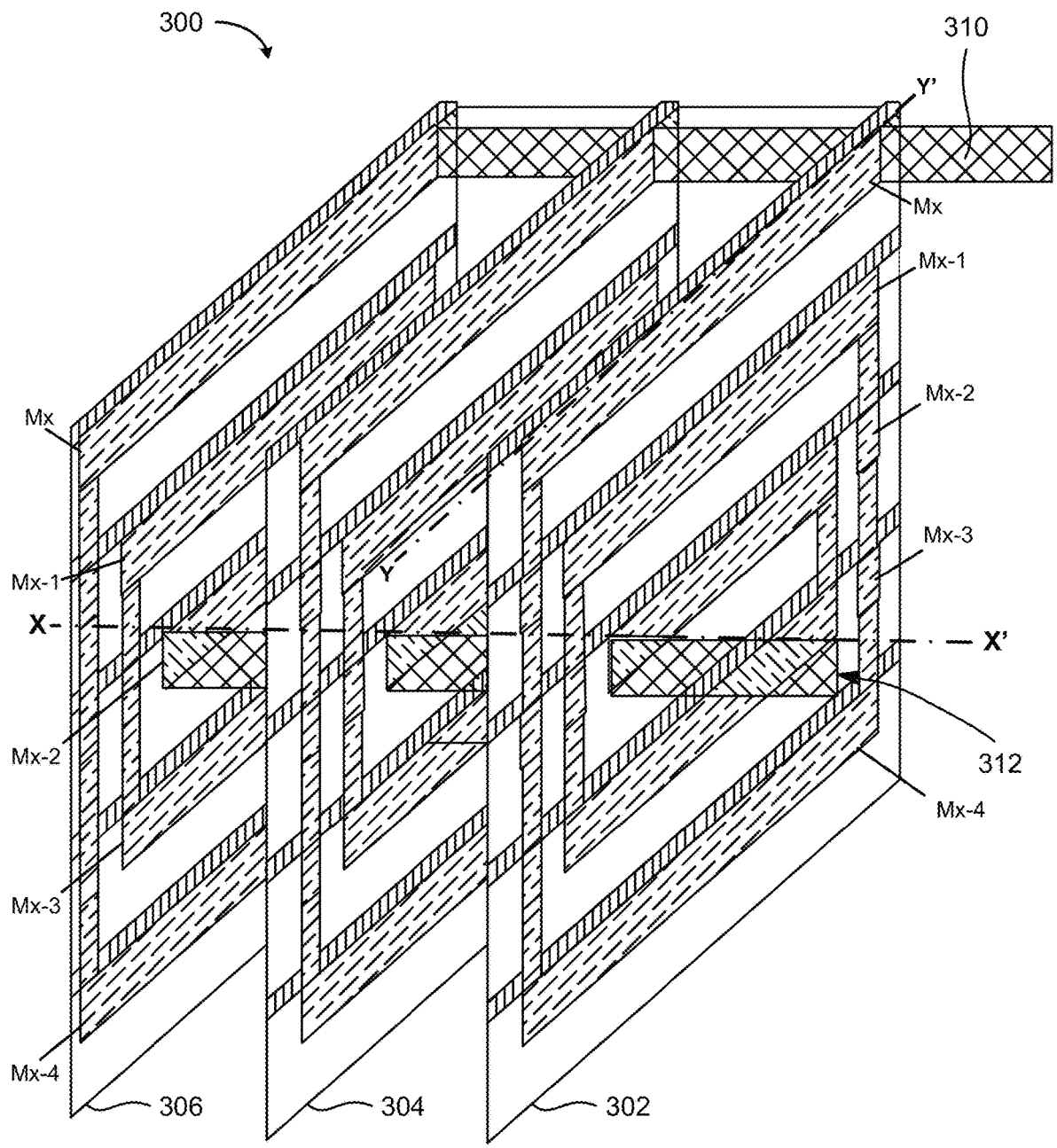
FIG. 3 illustrates a partial cross-sectional view of a vertical 3D spiral inductor connected in series in accordance with at least one aspect of the disclosure.

FIG. 3 illustrates another implementation of a vertical 3D spiral inductor 300 configuration illustrating three spiral conductive structures (e.g., spiral coils 302, 304 and 306) in parallel with each other and coupled to each other using conductor 310 and conductor 312 in a parallel configuration and positioned in a vertical orientation perpendicular to a substrate layer (not illustrated). An arrangement of the spiral conductive structures in relation to their orientation on the plurality of metal layers is shown in Mx, Mx-1, Mx-2, Mx-3, and Mx-4. These metal layers are presented for purposes of illustration and more metal layers or fewer metal layers may be used in accordance with the various aspects disclosed. The various aspects disclosed allow for higher Q factors, as well as a lower resistance (R), in comparison to conventional designs. In some aspects, the substrate may include one or more of an active component, a passive component and/or metal routings located under on or more of the spiral coils (e.g., spiral coils 302, 304 and 306), which in conventional designs would require a protective layer of shielding, as well as the related KOZs discussed earlier. In contrast to the conventional art, in the illustrated aspect, there are three parallel spiral coils 302, 304 and 306, which may be considered as one spiral inductor or individual spiral inductors, and again, there is no requirement to use a bottom shield above the substrate.

Figure 4:
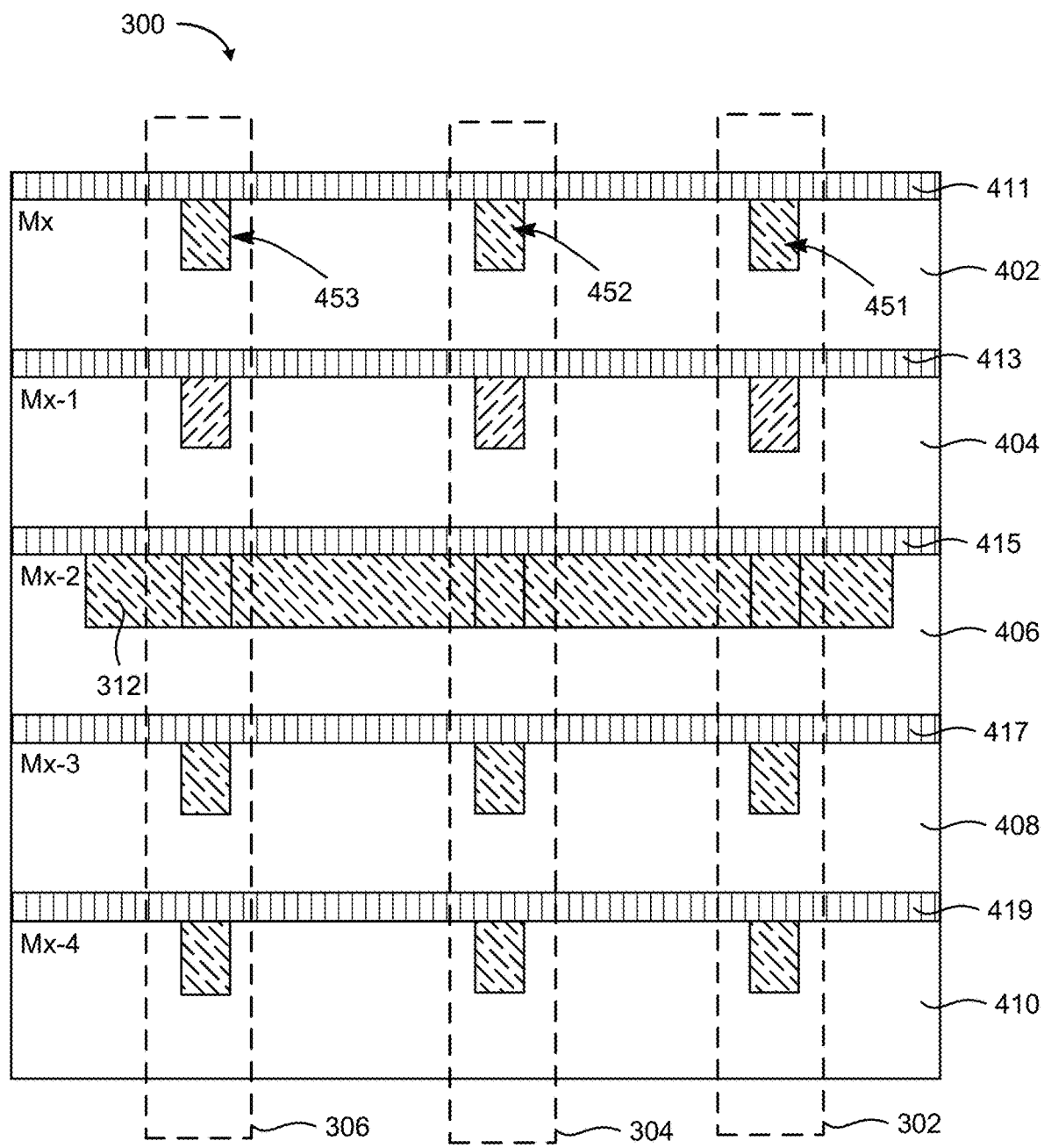
FIG. 4 illustrates a partial cross-sectional view of a vertical 3D spiral inductor in accordance with at least one aspect of the disclosure.

FIG. 4 illustrates a partial cross-sectional view of a vertical 3D spiral inductor along the X-X' reference line in FIG. 3 of inductor 300 in accordance with various aspects of the disclosure. Again, exemplary metal layers are shown in Mx, Mx-1, Mx-2, Mx-3, and Mx-4. The dielectric insulating layers (e.g., IMDs) are shown in 402, 404, 406, 408, and 410. Insulation layers 411, 413, 415, 417, and 419 may be disposed on respective dielectric layers (402, 404, 406, 408, and 410). The insulation layers 411, 413, 415, 417, and 419 also may serve as diffusion barrier layers to cover the top of metal layers and can be silicon carbon nitride (SiCN), for example. The insulation layers 411, 413, 415, 417, and 419 may also serve as a contact etch stop layer. Again, as discussed previously in FIG. 3, the solid unbroken line of connectors and vias shown in 312 is illustrated in that matter to show the spiral inductors connected in a parallel configuration.

In FIG. 4, first portions 451 of the first spiral coil 302 in a given metal layer are represented in a cross-section view. The other similar shaped and sized second portions 452 for second spiral coil 304 and third portions 453 for third spiral coil 306 are also shown in the FIG. 4, but each of the portions are not labeled with unique reference numbers. It will be appreciated that the various portions (e.g., 451, 452, and 453) can be formed by patterning and etching the various metal layers (e.g., Mx, Mx-1, Mx-2, Mx-3, and Mx-4) to form the various inductor portions and interconnect the various coils (e.g., 312 and 310). These met layer portions (e.g., 451, 452, and 453) are coupled by the vias to form the vertical coils (e.g., 302, 304, and 306). It will be appreciated that the various portions, interconnections and vias can be fabricated in the back end of line (BEOL) stack during conventional BEOL processing.

Figure 5:
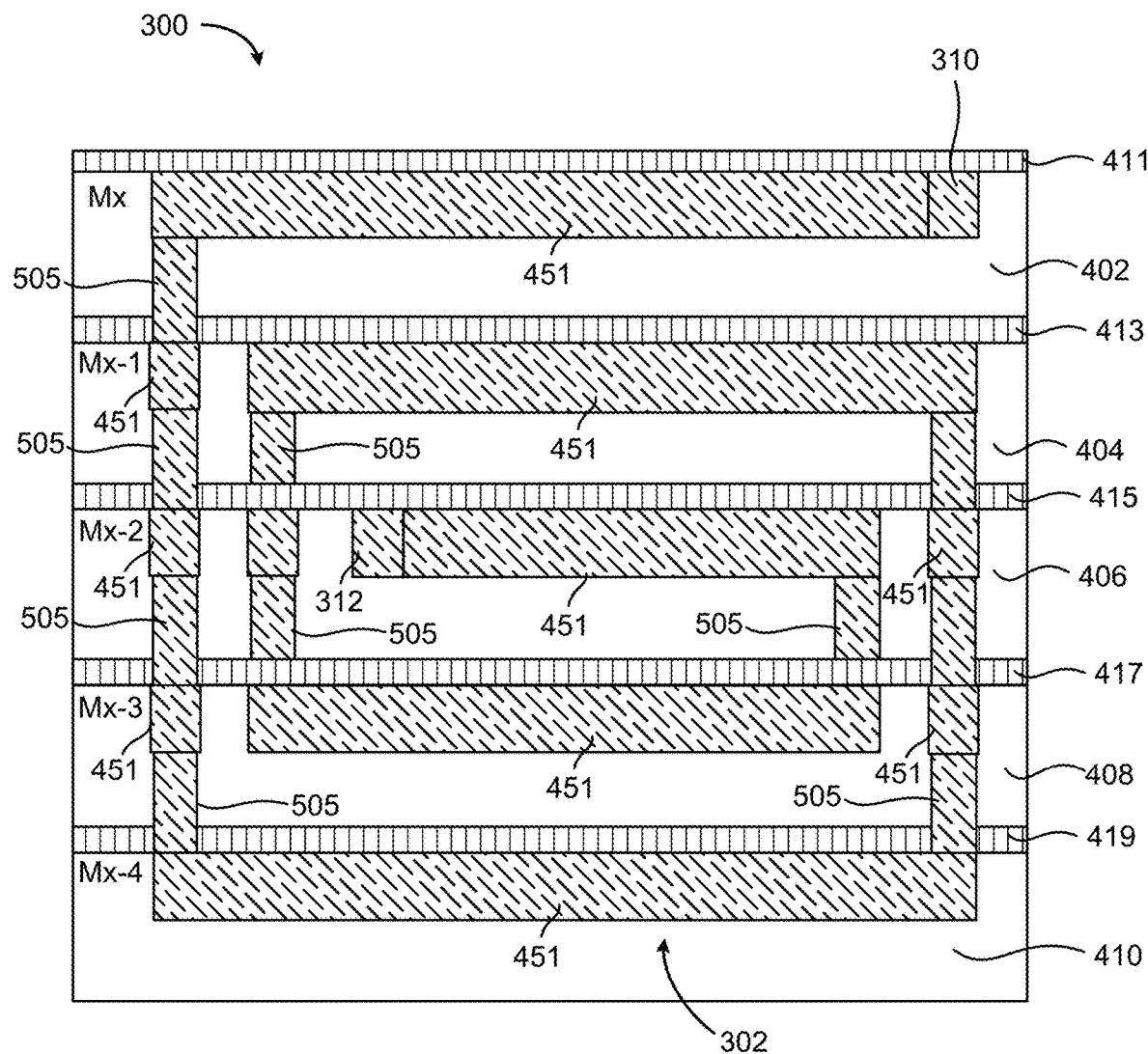
FIG. 5 illustrates a partial cross-sectional view of a vertical 3D spiral inductor in accordance with at least one aspect of the disclosure.

FIG. 5 illustrates another view of the vertical 3D spiral inductor 300 in a Y-Y' reference frame, as noted by the Y-Y' reference line in FIG. 3, in accordance with various aspects of the disclosure. In the illustrated aspect, the cross-sectional view of spiral coil 302 includes the dielectric layers 402, 404, 406, 408, and 410 and insulation layers 411, 413, 415, 417, and 419 as well as cross sectional views of metal layers Mx, Mx-1, Mx-2, Mx-3, and Mx-4. The spiral coil 302 is formed from Mx, Mx-1, Mx-2, Mx-3, and Mx-4 and a first set of vias 505 of a plurality of vias, which are configured to couple the various portions of the metal layers Mx, Mx-1, Mx-2, Mx-3, and Mx-4 to form the spiral coil 302 configured as a singular, continuous coil. The vias 505 penetrate through the dielectric and insulating layers (e.g., 402 and 413) to couple various portions of the metal layers (e.g., MX and MX-1). The ends of spiral coil 302 are coupled to conductor 310 and conductor 312, which are coupled to the other spiral coils in a parallel connection. For brevity, each via 505 and related coupling will not be discussed herein in detail. Further, it will be appreciated that each spiral coil will have a set of vias to couple the various metal layer portions forming the spiral coil. For example, a first set of vias 505 may couple the first portions 451 of the metal layers (layers Mx, Mx-1, Mx-2, Mx-3, and Mx-4) in the first spiral coil 302. A second set of vias may couple the second portions 452 of the metal layers (layers Mx, Mx-1, Mx-2, Mx-3, and Mx-4) in the second spiral coil 304. A third set of vias may couple the second portions 453 of the metal layers (layers Mx, Mx-1, Mx-2, Mx-3, and Mx-4) in the second spiral coil 306. It will be appreciated that the terms "first", "second" and "third" are used merely for convenience and do not necessarily impart any order and should not be construed to limit the various aspects to the illustrated configurations.

From the disclosure herein, it will be appreciated that various aspects can include an apparatus including a spiral inductor (e.g., 300) having a plurality of dielectric layers (e.g., 402, 404, 406, 408, and 410) formed on a substrate. A plurality of conductive layers (e.g., Mx, Mx-1, Mx-2, Mx-3, and Mx-4) can be provided, each of the plurality of conductive layers disposed on each of the plurality of dielectric layers. A plurality of insulating layers (e.g., 411, 413, 415, 417, and 419) are provided, each disposed on each of the conductive layers and configured to separate each of the dielectric layers. A plurality of vias (e.g., 505) are provided. A first spiral coil (e.g., 302) is arranged in a first plane perpendicular to the substrate. The first spiral coil (e.g., 302) is formed of first portions (e.g., 451) of the plurality of conductive layers and a first set of vias (e.g., 505), of the plurality of vias, configured to couple the first portions of the plurality of conductive layers (e.g., Mx, Mx-1, Mx-2, Mx-3, and Mx-4). As noted above, the 3D vertical inductor configuration provides at least the technical advantage of reduced electromagnetic interference the device layers above and/or below the 3D vertical inductor, which reduces or eliminates the need for KOZs adjacent the inductor. It will be appreciated the illustrated configurations provided herein are merely to provide examples and facilitate discussion of the various aspects disclosed. However, the various aspects disclosed are not limited to the specific illustrated configurations.

Figure 6:
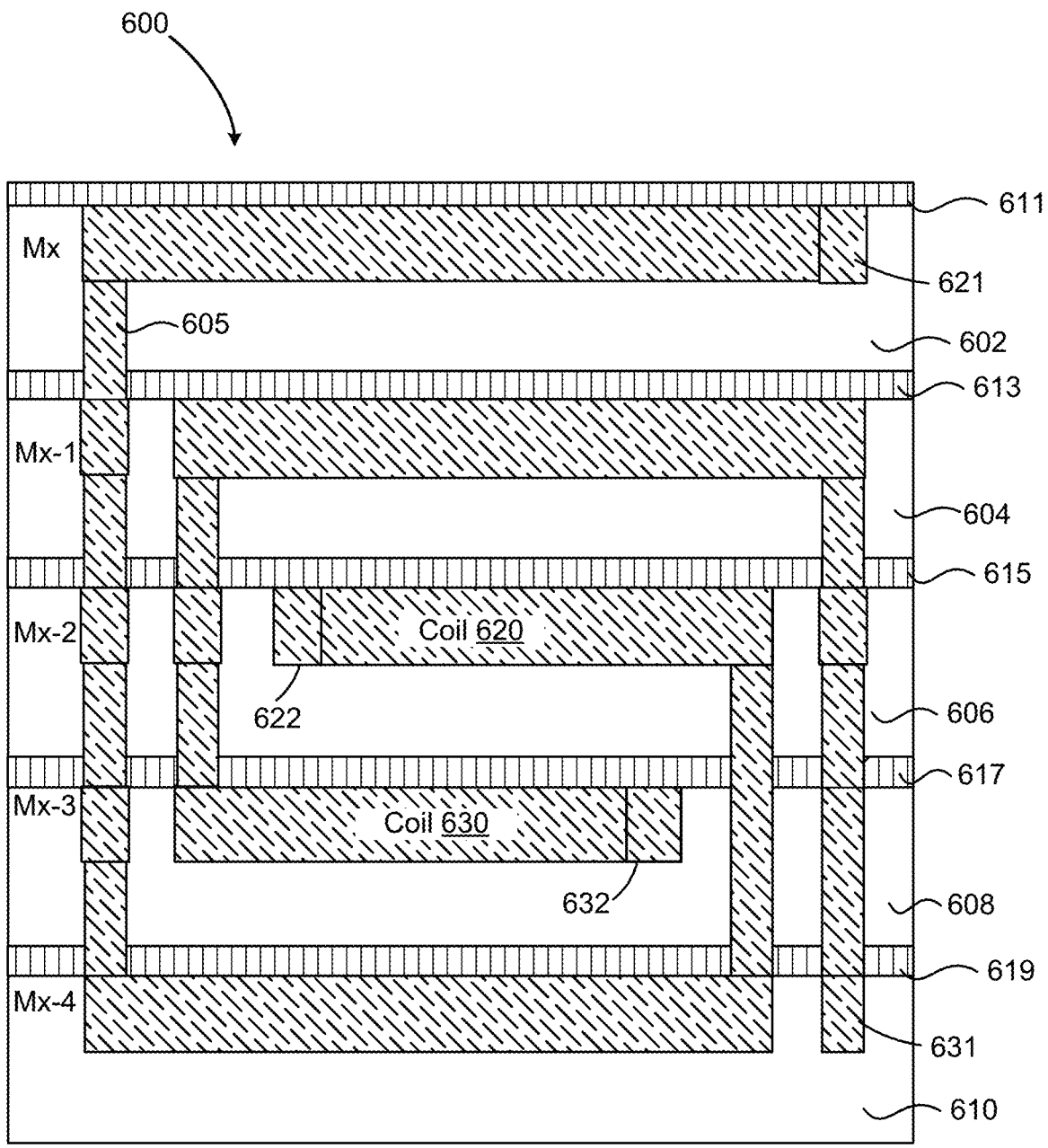
FIG. 6 illustrates another a partial cross-sectional view of a vertical 3D spiral inductor including two nested coils located in one plane in accordance with at least one aspect of the disclosure.

FIG. 6 illustrates another configuration of a vertical 3D spiral inductor 600, in accordance with various aspects of the disclosure. It will be appreciated vertical 3D spiral inductor 600 may be similar to inductor 300 and the coils 620 and 630 may be illustrated in a similar Y-Y' reference frame, similar to coil 302, as noted by the Y-Y' reference line in FIG. 3. FIG. 6 also can be referred to as a vertically stacked inductor configuration or a vertically stacked transformer configuration. In the illustrated aspect, the cross-sectional view of spiral coils 620 and 630 includes the dielectric layers 602, 604, 606, 608, and 610 and insulation layers 611, 613, 615, 617, and 619 as well as cross sectional views of metal layers Mx, Mx-1, Mx-2, Mx-3, and Mx-4. The spiral coils 620 and 630 are formed from Mx, Mx-1, Mx-2, Mx-3, and Mx-4 and vias 605, which are couple to the various portions of the metal layers Mx, Mx-1, Mx-2, Mx-3, and Mx-4 to form the spiral coils 620 and 630 configured as two interleaved continuous coils. The vias 605 penetrated through the dielectric and insulating layers (e.g., 602 and 613) to couple various portions of the metal layers (e.g., MX and MX-1). For brevity, each via 605 and related coupling will not be discussed herein in detail. The spiral coil 620 has a first end 621 and a second end 622, which in some aspects may be configured as an input tap or output tap. The spiral coil 630 has a first end 631 and a second end 632, which in some aspects may be configured as an input tap or output tap. The spiral coils shown in FIG. 6 are shown in a parallel connection or open-end configuration. Coils 620 and 630 in some aspects be a vertically stacked transformer configuration. In other aspects, the ends could be connected such that coils 620 and 630 are in a series configuration. In further aspects, it will be appreciated that the ends (e.g., 621, 622, 631, 632) may be connected to other coils (not illustrated) in either series or parallel configurations based on various design considerations. Accordingly, it will be appreciated that the various aspects disclosed are not limited to the illustrated configurations.

Figure 7:
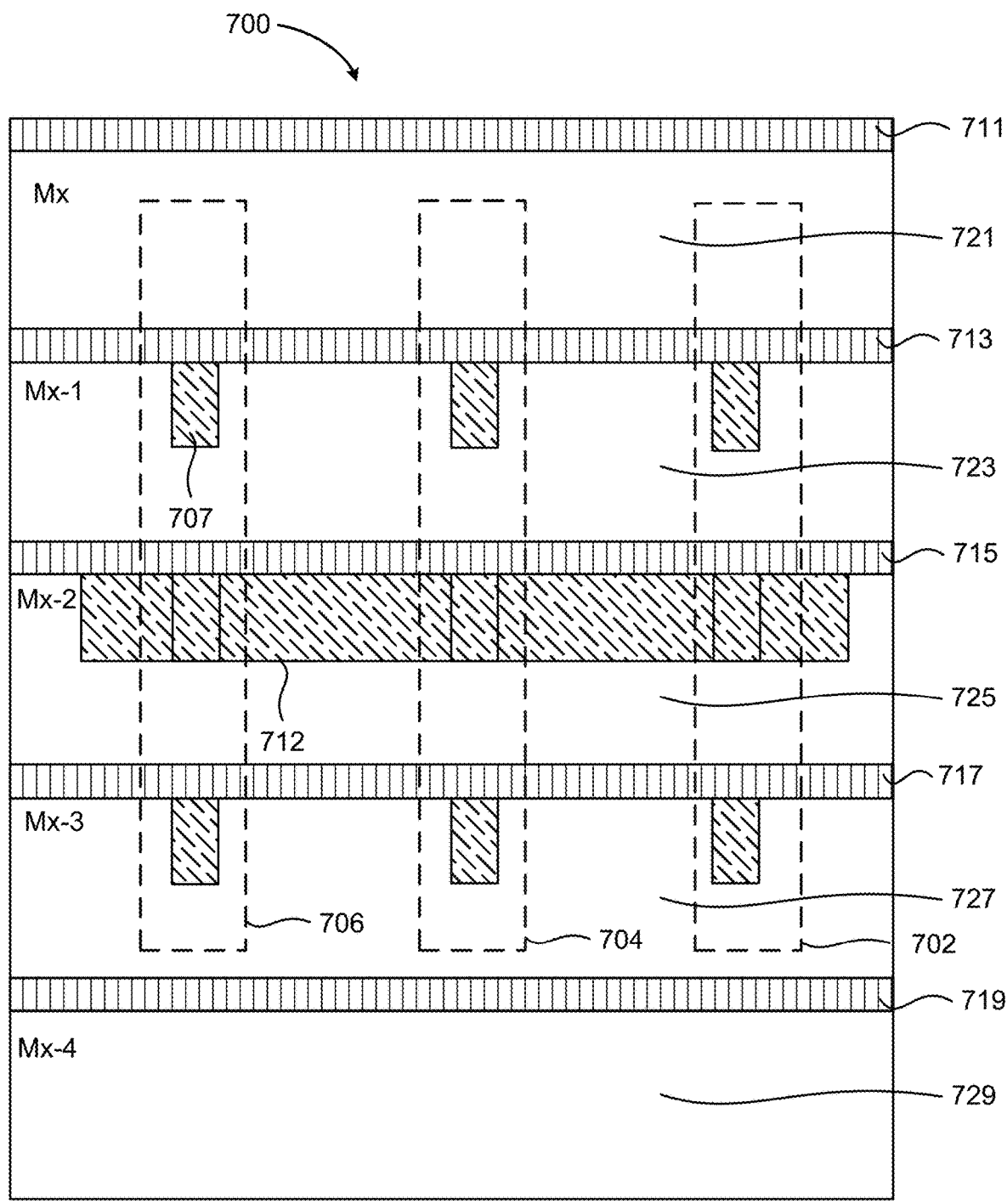
FIG. 7 illustrates a partial cross-sectional view of a vertical 3D spiral inductor in accordance with at least one aspect of the disclosure.

FIG. 7 illustrates a partial cross-sectional view of a vertical 3D spiral inductor 700 in accordance with at least one aspect of the disclosure. The cross-sectional view of inductor 700 is in a similar X-X' reference frame, as illustrated in relation to the inductor of FIG. 3. In FIG. 7, various metal layers are shown, such as, metal layers Mx, Mx-1, Mx-2, Mx-3, and Mx-4. For simplicity of illustration, there are no metal portions illustrated in layers Mx and Mx-4. However, it will be appreciated that these layers could be used for additional electrical routing and connections. The dielectric layers 721, 723, 725, 727, and 729 and insulation layers 711, 713, 715, 717, and 719 are also illustrated. In the illustrated aspect, three coils 702, 704, and 706 are shown in the X-X' reference frame.

As before, for ease of illustration in FIG. 7, 707 refers to what the spiral conductor element would look like in a cross-sectional view. The other similar shaped and sized spiral conductor elements are also shown in the FIG. 7, but they are not labeled with unique reference numbers. Also illustrated is a conductor 712 which connects the coils 702, 704 and 706 in parallel. It will be appreciated that in the illustrated configuration, only three metal layers (Mx-1, Mx-2, and Mx-3) are used to form the inductors. While reducing the inductance this illustrates that the various aspects disclosed may use three or more of the metal layers, which allows for additional routing flexibility on the unused metal layers. Additionally, it will be appreciated that the metal layers used could have been in any combination of the metal layers (such as, (Mx, Mx-1 and Mx-2), (Mx-2, Mx-3, and Mx-4), (Mx, Mx-2 and Mx-4), etc.). Accordingly, the various aspects disclosed are not limited to the illustrated configurations.

Figure 8:
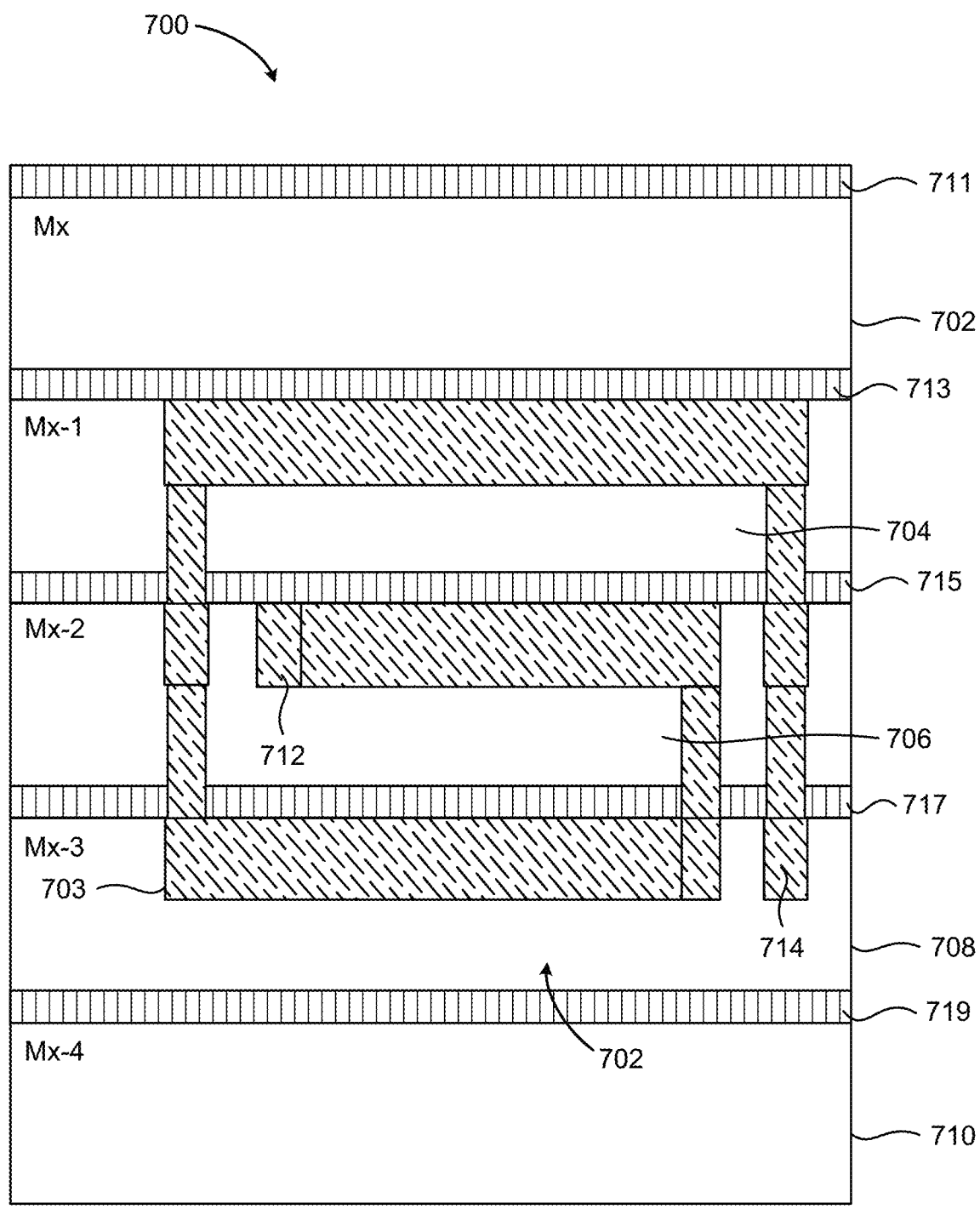
FIG. 8 illustrates a partial cross-sectional view of a vertical 3D spiral inductor in accordance with at least one aspect of the disclosure.

FIG. 8 illustrates a partial cross-sectional view of the vertical 3D spiral inductor 700 in accordance with at least one aspect of the disclosure. The cross-sectional view of inductor 700 is in a similar Y-Y' reference frame including coil 702, which is a similar reference frame as coil 302, as illustrated in relation to the inductor 300 of FIG. 3. In the illustrated aspect, there are five metal layers Mx, Mx-1, Mx-2, Mx-3, and Mx-4. For simplicity of illustration, there are no metal portions illustrated in layers Mx and Mx-4. However, it will be appreciated that these layers could be used for additional electrical routing and connections. The dielectric layers 721, 723, 725, 727, and 729 and insulation layers 711, 713, 715, 717, and 719 are also illustrated. The coil 702 is formed from three metal layers (Mx-1, Mx-2, and Mx-3, as shown). Conductor 712 which connects the coils 702, 704 and 706 in parallel at a first end is illustrated in cross-section. Also, illustrated in cross-section is a conductor 714 which connects the coils 702, 704 and 706 in parallel at a second end of the inductors, but only the connection to inductor 702 is illustrated.

Figure 9:
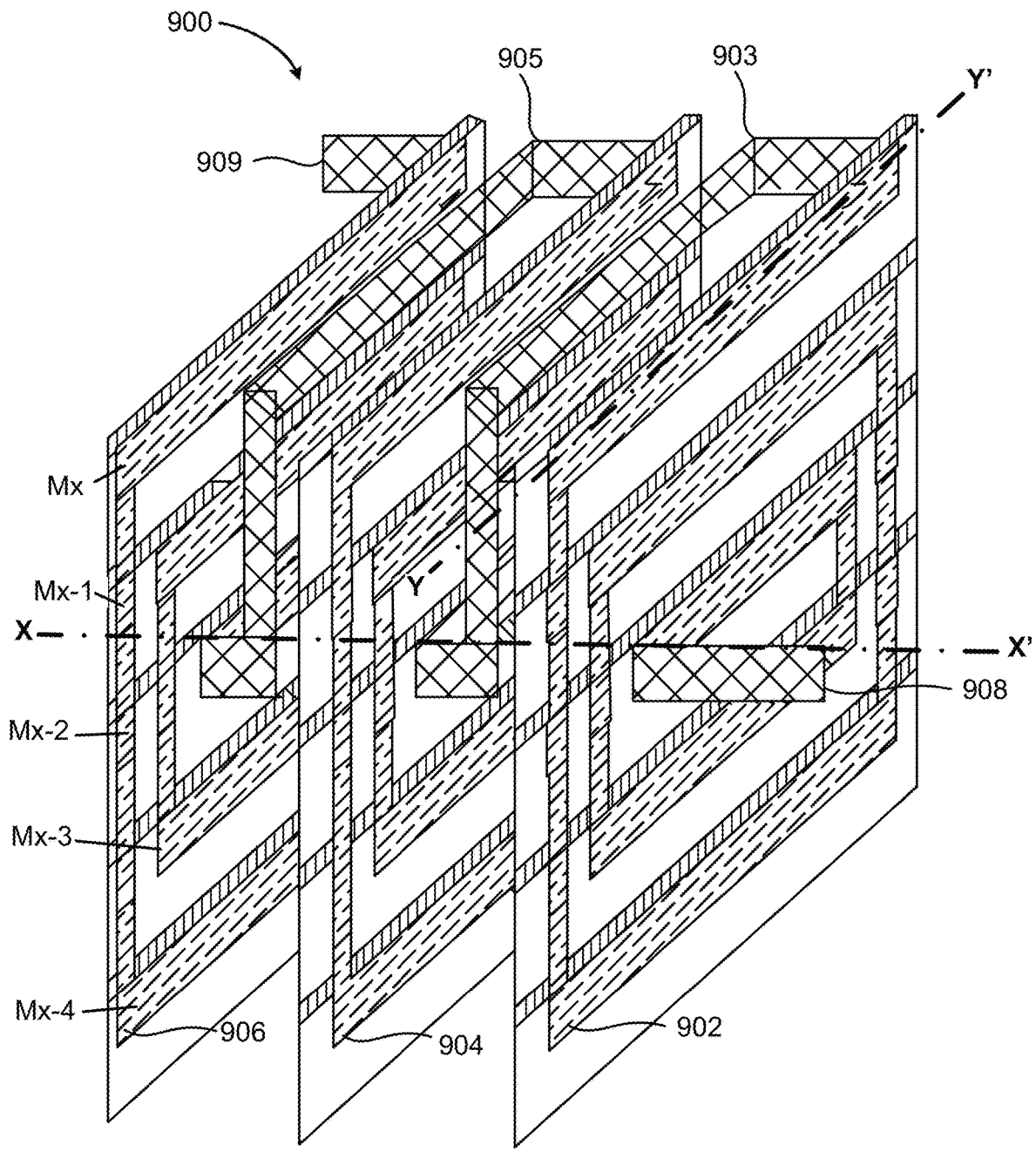
FIG. 9 illustrates a partial cross-sectional view of a vertical 3D spiral inductor connected in parallel in accordance with at least one aspect of the disclosure.

FIG. 9 illustrates a partial cross-sectional view of a vertical 3D spiral inductor 900 in accordance with at least one aspect of the disclosure. Three spiral structural coils 902, 904 and 906 are positioned in a vertical orientation and in this configuration, are connected in series with each other by conductors 903 and 905. A first end 908 and second end 909 of the inductor 900 are also illustrated. The ends 908 and 909 can be used to couple the inductor to other components and/or additional coils.

Figure 10:
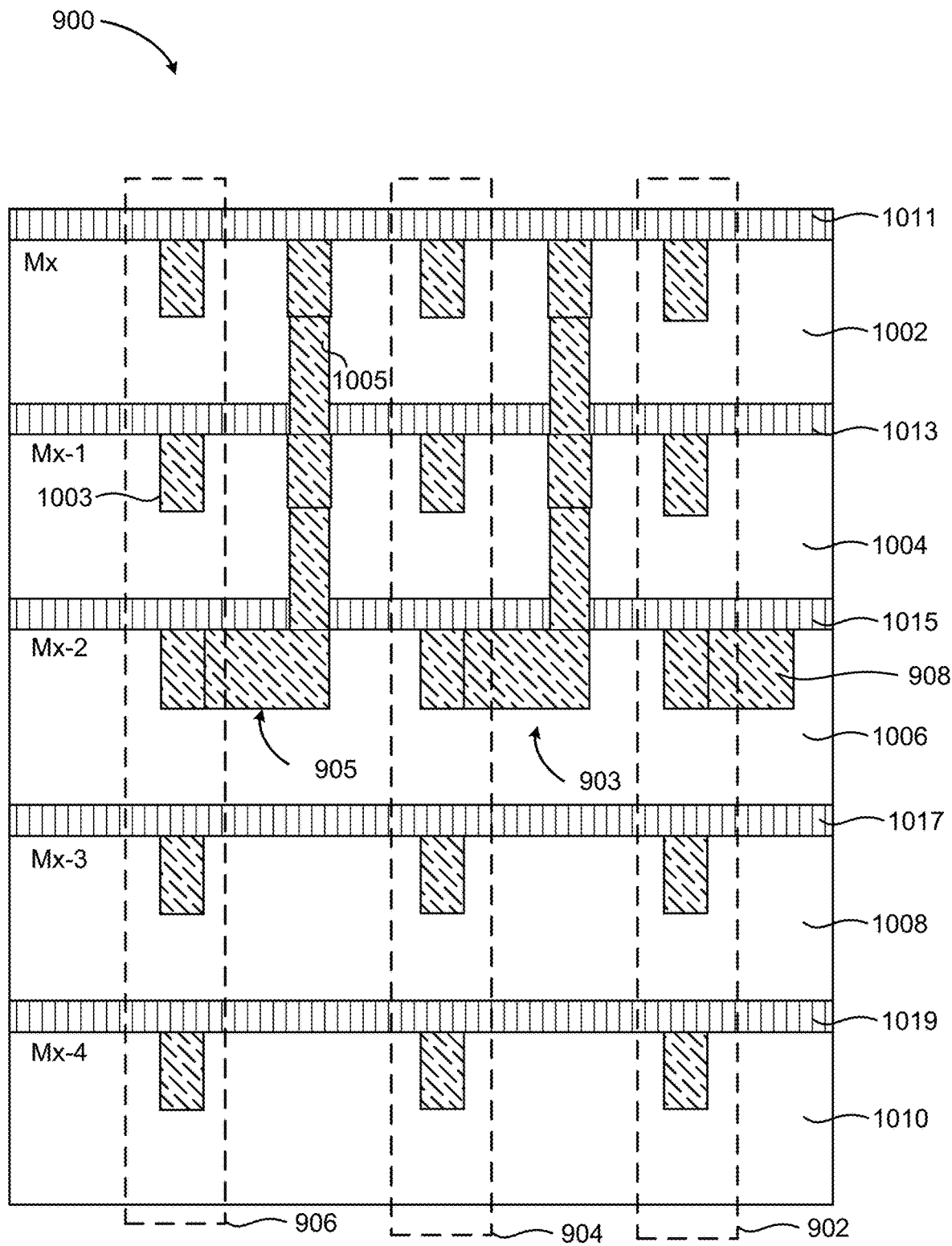
FIG. 10 illustrates a partial cross-sectional view of a vertical 3D spiral inductor in accordance with at least one aspect of the disclosure.

FIG. 10 illustrates a partial cross-sectional view of a vertical 3D spiral inductor 900 in a X-X' reference frame illustrated in FIG. 9, in accordance with at least one aspect of the disclosure. Again, dielectric layers 1002, 1004, 1006, 1008, and 1010 and insulation layers 1011, 1013, 1015, 1017, and 1019 as well as cross sectional views of metal layers Mx, Mx-1, Mx-2, Mx-3, and Mx-4 are illustrated. As noted above, coils 902, 904 and 906 are connected in a series coupling configuration. Specifically, first conductor 903 couples coil 902 to coil 904. Second conductor 905 couples coil 904 to coil 906. The first conductor 903 and second conductor 905 are formed from vias 1005 and portions of the metal layers (e.g., Mx, Mx-1, and Mx-2) disposed between the respective coils being coupled. For example, as illustrated, first conductor 903 is disposed between coils 902 and 904, and second conductor 905 is disposed between coils 904 and 906. Further, as illustrated, first end 908 is coupled to coil 902 to provide an external coupling point. For ease of illustration in FIG. 10, 1003 refers to what portion of the spiral conductor element would look like in a cross-sectional view. The other similar shaped and sized spiral conductor elements are also shown in the FIG. 10, but they are not labeled with unique reference numbers. It will be appreciated that the illustrated aspects are provided merely for illustration and the various aspects disclosed are not limited to the illustrated configuration. For example, the conductors 903 and 905 could be located in different layers and the coupling of the coils accomplished in other positions. Accordingly, it will be appreciated that the various aspects disclosed are not limited to the illustrated configurations.

Figure 11:
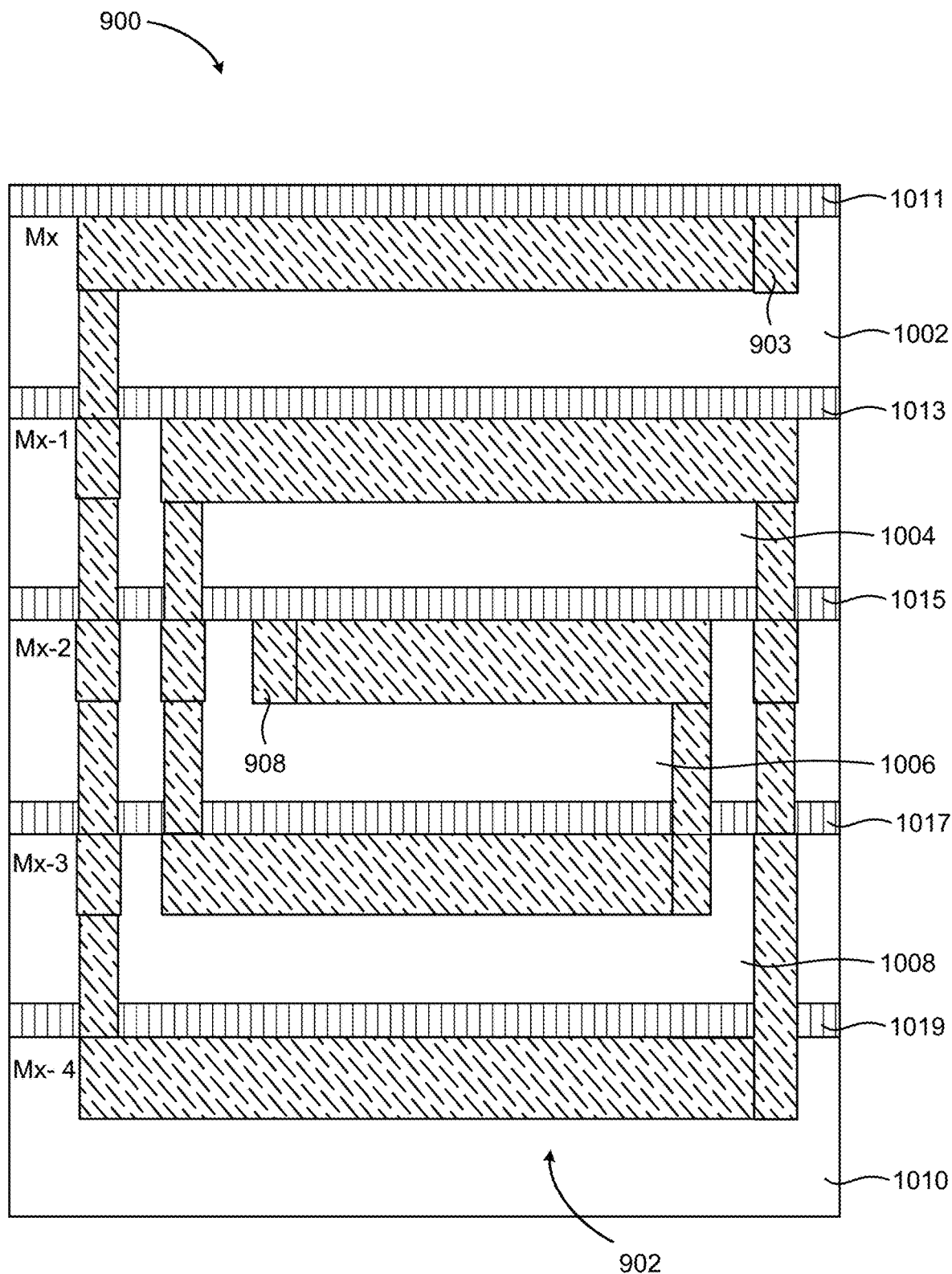
FIG. 11 illustrates a partial cross-sectional view of a vertical 3D spiral inductor in accordance with at least one aspect of the disclosure.

FIG. 11 illustrates a partial top view of a vertical 3D spiral inductor 900 in a Y-Y' reference frame in accordance with at least one aspect of the disclosure. Again, dielectric layers 1002, 1004, 1006, 1008, and 1010 and insulation layers 1011, 1013, 1015, 1017, and 1019 as well as cross sectional views of metal layers Mx, Mx-1, Mx-2, Mx-3, and Mx-4 are illustrated. As noted above, coils 902, 904 and 906 are connected in a series coupling configuration, however, in this view only coil 902 is illustrated. The first conductor 903, as illustrated, is coupled to a top portion of coil 902 in metal layer Mx, which forms part of the connection to coil 904 (not illustrated). Further, as illustrated, first end 908 is coupled to coil 902 toward the center of the coil in metal layer Mx-2 to provide an external coupling point, as discussed above. Once again, it will be appreciated that the illustrations are provided merely for explanation and not limitation of the various aspects disclosed.

Figure 12:
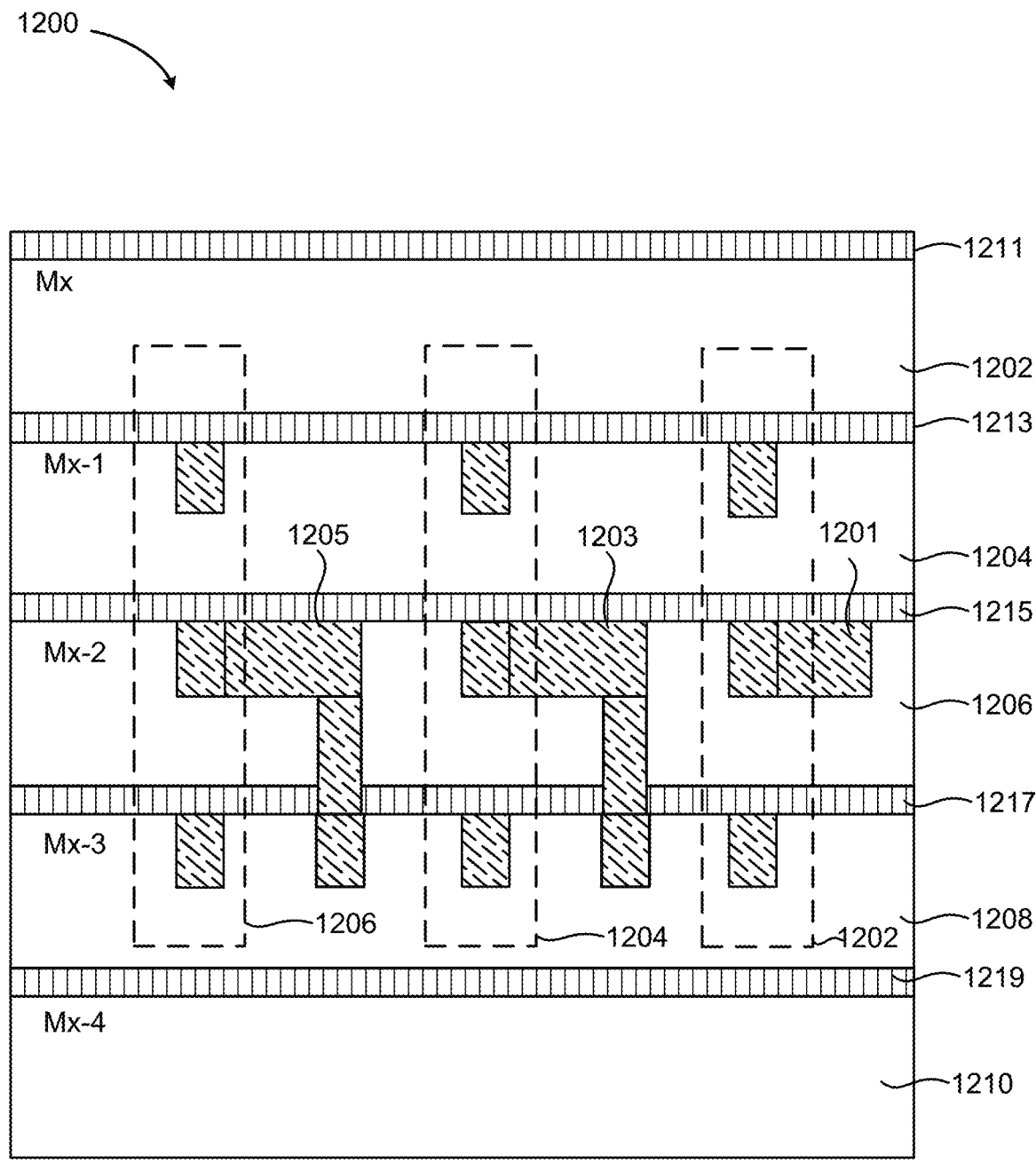
FIG. 12 illustrates a partial cross-sectional view of a vertical 3D spiral inductor in accordance with at least one aspect of the disclosure.

FIG. 12 illustrates a partial cross-sectional view of a vertically parallel 3D spiral inductor 1200 in a X-X' reference frame, in accordance with at least one aspect of the disclosure. The cross-sectional view of inductor 1200 is in a similar X-X' reference frame, as illustrated in relation to the inductor of FIG. 9. In FIG. 12, various metal layers are shown, such as, metal layers Mx, Mx-1, Mx-2, Mx-3, and Mx-4. For simplicity of illustration, there are no metal portions illustrated in layers Mx and Mx-4. However, it will be appreciated that these layers could be used for additional electrical routing and connections. The dielectric layers 1202, 1204, 1206, 1208, and 12010 and insulation layers 1211, 1213, 1215, 1217, and 1219 are also illustrated. In the illustrated aspect, three coils 1202, 1204, and 1206 are shown in the X-X' reference frame.

Also, as illustrated, 1202, 1204 and 1206 are connected in a series coupling configuration. Specifically, first conductor 1203 couples coil 1202 to coil 1204. Second conductor 1205 couples coil 1204 to coil 1206. The first conductor 1203 and second conductor 1205 are formed from vias and portions of the metal layers (e.g., Mx-2, and Mx-3) disposed between the respective coils being coupled. For example, as illustrated, first conductor 1203 is disposed between coils 1202 and 1204, and second conductor 1205 is disposed between coils 1204 and 1206. Further, as illustrated, first end 1201 is coupled to coil 1202 to provide an external coupling point. While reducing the inductance of the coil due to less turns, this configuration illustrates that the various aspects disclosed may use three or more of the metal layers, which allows for additional routing flexibility on the unused metal layers. Additionally, it will be appreciated that the metal layers used could have been in any combination of the metal layers (such as, (Mx, Mx-1 and Mx-2), (Mx-2, Mx-3, and Mx-4), (Mx, Mx-2 and Mx-4), etc.). Accordingly, the various aspects disclosed are not limited to the illustrated configurations.

Figure 13:
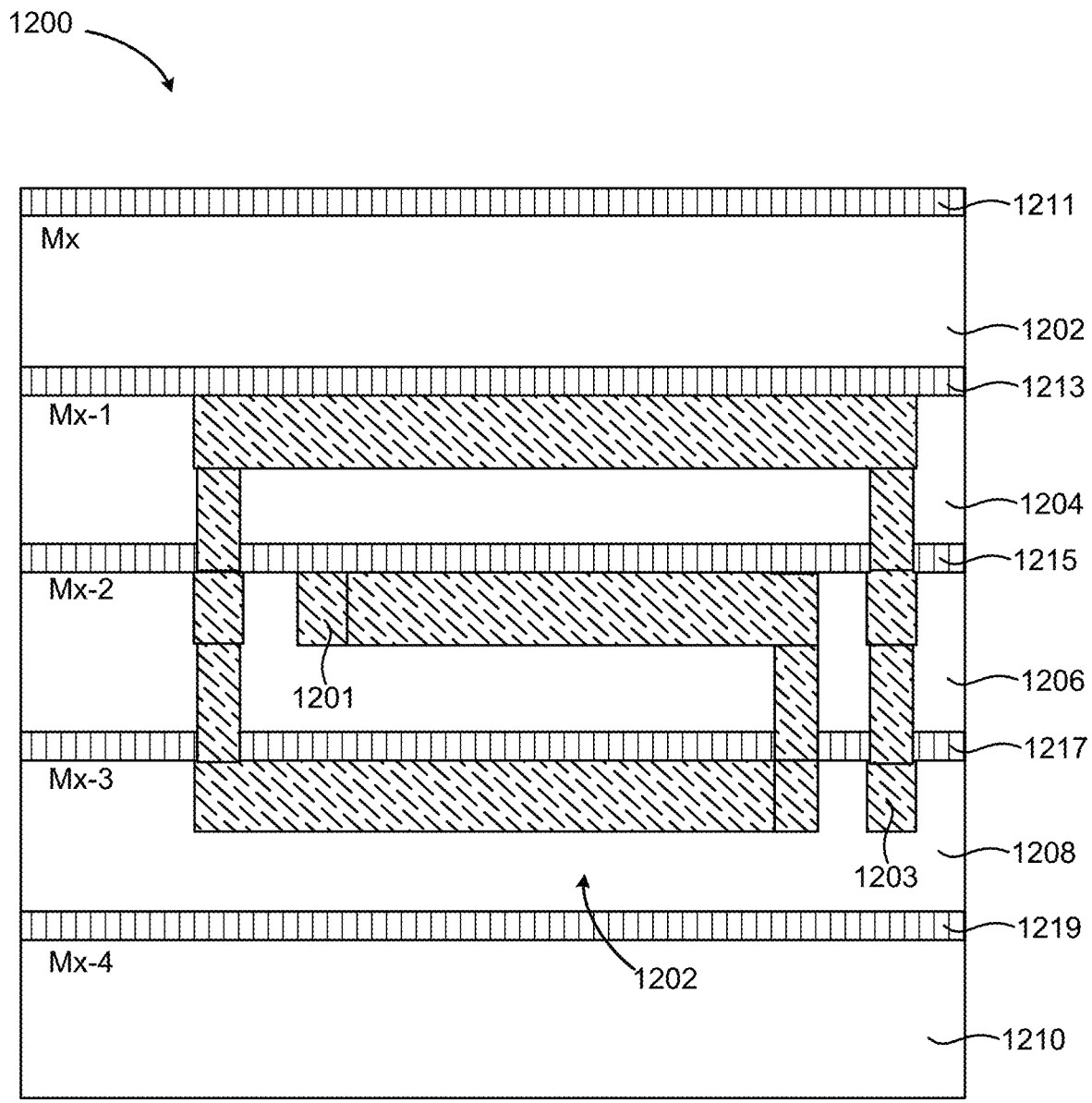
FIG. 13 illustrates a partial cross-sectional view of a vertical 3D spiral inductor in accordance with at least one aspect of the disclosure.

FIG. 13 illustrates a partial cross-sectional view of the vertical 3D spiral inductor 1200 in accordance with at least one aspect of the disclosure. The cross-sectional view of inductor 1200 is in a similar Y-Y' reference frame including coil 1202, which is a similar reference frame as coil 902, as illustrated in relation to the inductor 900 of FIG. 9. In the illustrated aspect, there are five metal layers Mx, Mx-1, Mx-2, Mx-3, and Mx-4. For simplicity of illustration, there are no metal portions illustrated in layers Mx and Mx-4. However, it will be appreciated that these layers could be used for additional electrical routing and connections. The dielectric layers 1202, 1204, 1206, 1208, and 12010 and insulation layers 1211, 1213, 1215, 1217, and 1219 are also illustrated. The coil 1202 is formed from three metal layers (Mx-1, Mx-2, and Mx-3, as shown). First end 1201, which connects the coil 1202 to external components is illustrated in cross-section. Also, illustrated in cross-section is a conductor 1203 which couples the coils 1202 and 1204 in series, but only the connection to inductor 1202 is illustrated.

Figure 14:
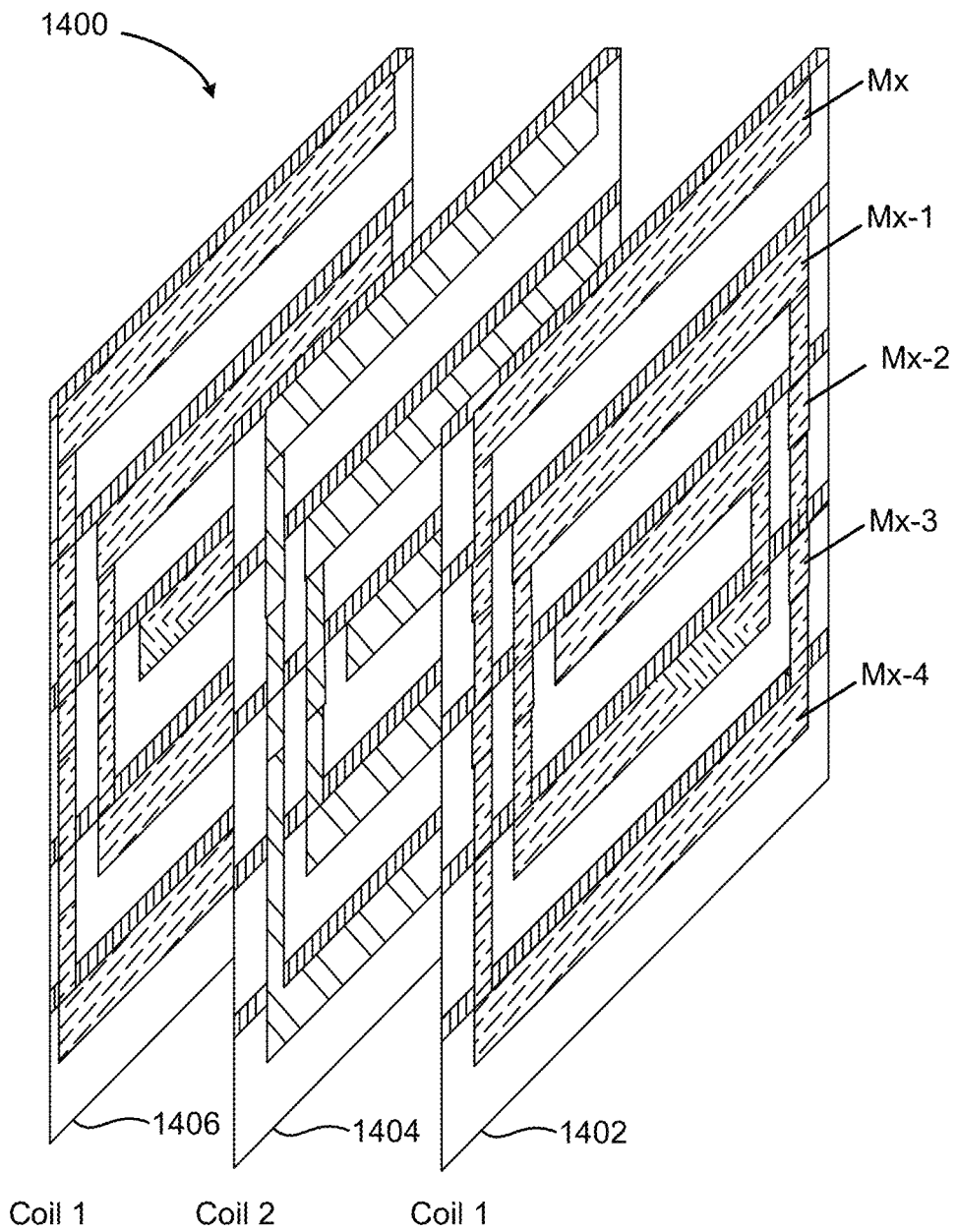
FIG. 14 illustrates a partial cross-sectional view of a vertical 3D spiral transformer in accordance with at least one aspect of the disclosure.

FIG. 14 illustrates a partial cross-sectional view of a vertical 3D spiral transformer 1400 in accordance with at least one aspect of the disclosure. In this aspect, the spiral windings 1402, 1404 and 1406 are connected in a transformer configuration. Specifically, windings 1402 and 1406 are coupled together to form a first coil (Coil 1) of the transformer 1400. The spiral winding 1404 forms a second coil (Coil 2) of the transformer 1400. The arrangement of the spiral windings 1402, 1404 and 1406 are formed vertically using metal layers, as shown in Mx, Mx-1, Mx-2, Mx-3, and Mx-4. Various input taps in and output taps may be selected to form a desired transformer configuration (not shown). Further, additional windings may be added to the first coil and/or second coil. Accordingly, the various aspects disclosed are not limited to the illustrated configurations.

Figure 15:
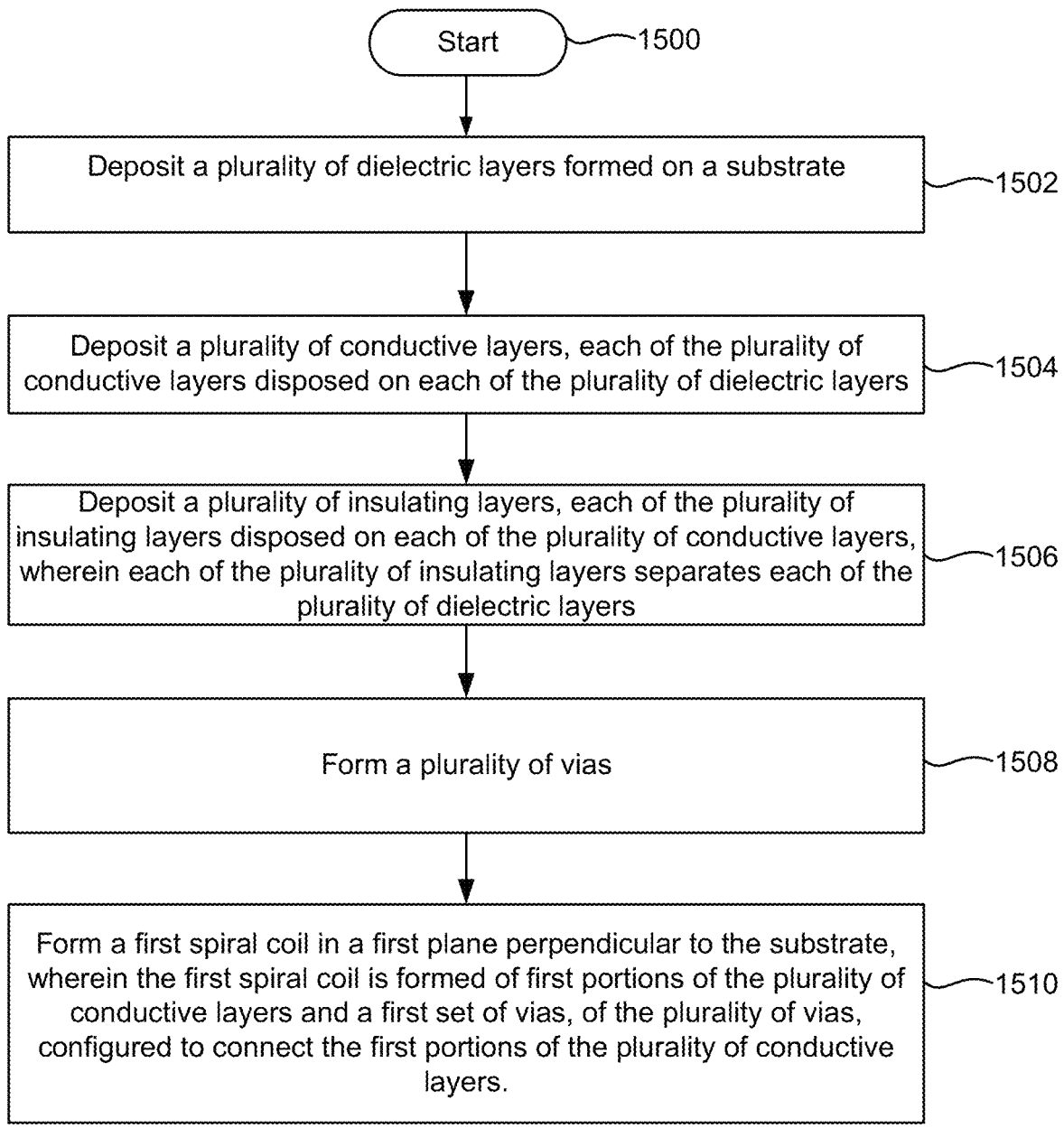
FIG. 15 illustrates an exemplary method for manufacturing a package in accordance with at least one aspect of the disclosure.

FIG. 15 illustrates an exemplary method 1500 of fabricating a spiral inductor in accordance with an aspect of the disclosure. Other methods of fabrication are possible, and the discussed fabrication methods are presented only as an aid to understand the various aspects disclosed herein. The method 1500 begins by depositing a plurality of dielectric layers on a substrate, in block 1502. The method continues in block 1504 with depositing a plurality of conductive layers, each of the plurality of conductive layers disposed on each of the plurality of dielectric layers. The method continues in block 1506 with depositing a plurality of insulating layers, each of the plurality of insulating layers disposed on each of the plurality of conductive layers, wherein each of the plurality of insulating layers separates each of the plurality of dielectric layers. The method continues in block 1508 with forming a plurality of vias. The method continues in block 1510 with forming a first spiral coil in a first plane perpendicular to the substrate, where the first spiral coil is formed of first portions of the plurality of conductive layers and a first set of vias, of the plurality of vias, configured to couple the first portions of the plurality of conductive layers.

It will be appreciated that the foregoing fabrication process was provided merely as general illustration of some of the aspects of the disclosure and is not intended to limit the disclosure or accompanying claims. Further, many details in the fabrication process known to those skilled in the art may have been omitted or combined in summary process portions to facilitate an understanding of the various aspects disclosed without a detailed rendition of each detail and/or all possible process variations.

The foregoing devices described or variants and other aspects similar to it may be incorporated into an apparatus selected from the group including of a music player, a video player, an entertainment unit, a navigation device, a communications device, a mobile device, a mobile phone, a smartphone, a personal digital assistant, a fixed location terminal, a tablet computer, a computer, a wearable device, an Internet of things (IoT) device, a laptop computer, a server, and a device in an automotive vehicle.

Figure 16:
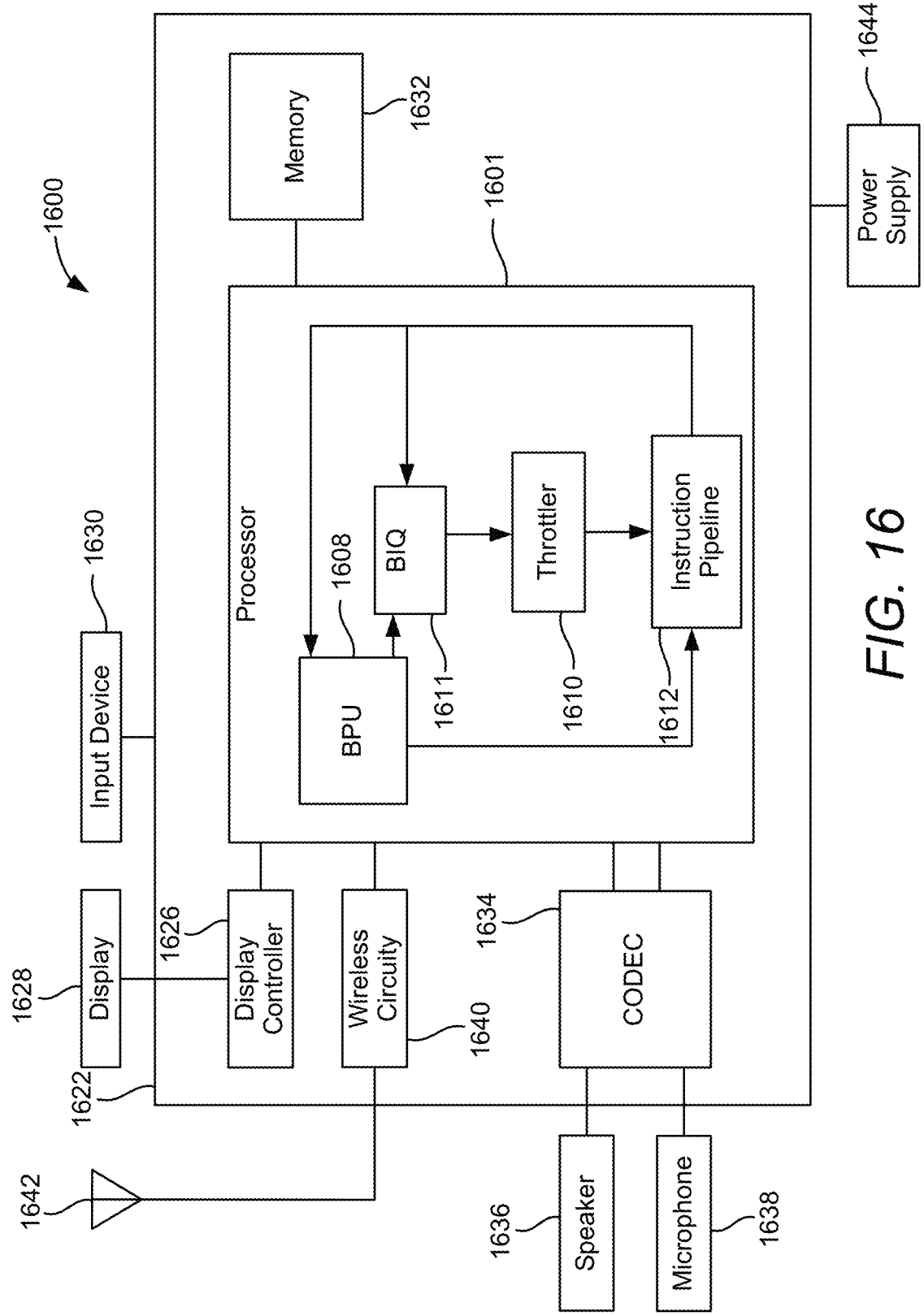
FIG. 16 illustrates a mobile device in accordance with at least one aspect of the disclosure.

FIG. 16 illustrates an exemplary mobile device in accordance with some examples of the disclosure. Referring now to FIG. 16, a block diagram of a mobile device that is configured according to exemplary aspects is depicted and generally designated mobile device 1600. In some aspects, mobile device 1600 may be configured as a wireless communication device. As shown, mobile device 1600 includes processor 1601. Processor 1601 is shown to comprise instruction pipeline 1612, buffer processing unit (BPU) 1608, branch instruction queue (BIQ) 1611, and a throttler 1610 as is known in the art. Other well-known details (e.g., counters, entries, confidence fields, weighted sum, comparator, etc.) of these blocks have been omitted from this view of processor 1601 for the sake of clarity. Processor 1601 may be communicatively coupled to memory 1632 over a link, which may be a die-to-die or chip-to-chip link. Mobile device 1600 also includes display 1628 and display controller 1626, with display controller 1626 coupled to processor 1601 and to display 1628.

In some aspects, FIG. 16 may include coder/decoder (CODEC) 1634 (e.g., an audio and/or voice CODEC) coupled to processor 1601; speaker 1636 and microphone 1638 coupled to CODEC 1634; and wireless circuits 1640 (which may include a modem, RF circuitry, filters, etc., which may use the various 3d spiral inductors and/or transformers disclosed herein) coupled to wireless antenna 1642 and to processor 1601.

In a particular aspect, where one or more of the above-mentioned blocks are present, processor 1601, display controller 1626, memory 1632, CODEC 1634, and wireless circuits 1640 can be included in a system-in-package or system-on-chip device 1622. Input device 1630 (e.g., physical or virtual keyboard), power supply 1644 (e.g., battery), display 1628, input device 1630, speaker 1636, microphone 1638, wireless antenna 1642, and power supply 1644 may be external to system-on-chip device 1622 and may be coupled to a component of system-on-chip device 1622, such as an interface or a power management controller. The various 3D spiral inductors disclosed herein may be used in portions of the power supply coupling circuits.

It should be noted that although FIG. 16 depicts a mobile device, processor 1601 and memory 1632 may also be integrated into a set top box, a music player, a video player, an entertainment unit, a navigation device, a personal digital assistant (PDA), a fixed location data unit, a computer, a laptop, a tablet, a communications device, a mobile phone, or other similar devices.

Figure 17:
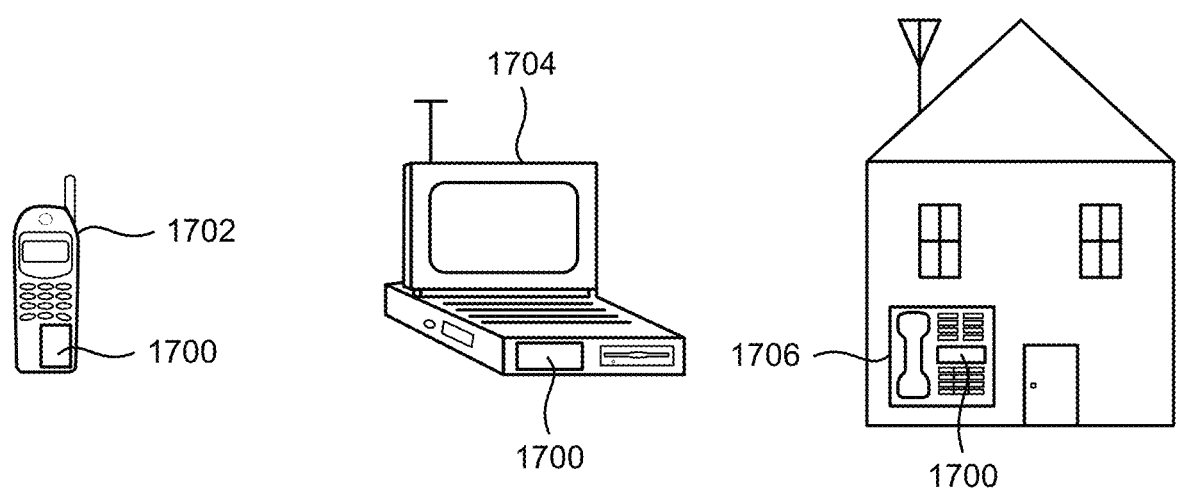
FIG. 17 illustrates various electronic devices that may be integrated with any of the 3D spiral inductors disclosed herein, in accordance with some examples of the disclosure.

FIG. 17 illustrates various electronic devices that may be integrated with any of the aforementioned transistor cells in accordance with some examples of the disclosure. For example, a mobile phone device 1702, a laptop computer device 1704, and a fixed location terminal device 1706 may include a semiconductor device 1700 including the various 3D spiral inductors and/or transformers (e.g., 200, 300, 600, 700, 900, 1200, 1400) as described herein. The semiconductor device 1700 may be, for example, integrated circuits, dies, integrated devices, integrated device packages, integrated circuit devices, packages, integrated circuit packages, or package-on-package devices. The devices 1702, 1704, and 1706 illustrated in FIG. 17 are merely exemplary. Other electronic devices may also feature the semiconductor device 1700 including, but not limited to, a group of devices (e.g., electronic devices) that includes mobile devices, handheld personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles (e.g., autonomous vehicles), or any other device that stores or retrieves data or computer instructions, or any combination thereof.

The foregoing disclosed devices and functionalities may be designed and configured into computer files (e.g., register-transfer level (RTL), Geometric Data Stream (GDS) Gerber, and the like) stored on computer-readable media. Some or all such files may be provided to fabrication handlers who fabricate devices based on such files. Resulting products may include semiconductor wafers that are then cut into semiconductor die and packaged into semiconductor packages, integrated devices, system-on-chip devices, and the like, which may then be employed in the various devices described herein.

It will be appreciated that various aspects disclosed herein can be described as functional equivalents to the structures, materials and/or devices described and/or recognized by those skilled in the art. For example, in one aspect, an apparatus may comprise a means for performing the various functionalities discussed above. It will be appreciated that the aforementioned aspects are merely provided as examples and the various aspects claimed are not limited to the specific references and/or illustrations cited as examples.

One or more of the components, processes, features, and/or functions illustrated in FIGS. 2-17 may be rearranged and/or combined into a single component, process, feature, or function or incorporated in several components, processes, or functions. Additional elements, components, processes, and/or functions may also be added without departing from the disclosure. It should also be noted that FIGS. 1-16 and corresponding description in the present disclosure are not limited to dies and/or ICs. In some implementations, FIGS. 2-17 and the corresponding description may be used to manufacture, create, provide, and/or produce integrated devices. In some implementations, a device may include a die, an integrated device, a die package, an integrated circuit (IC), a device package, an integrated circuit (IC) package, a wafer, a semiconductor device, a package on package (PoP) device, and/or an interposer.

As used herein, the terms "user equipment" (or "UE"), "user device," "user terminal," "client device," "communication device," "wireless device," "wireless communications device," "handheld device," "mobile device," "mobile terminal," "mobile station," "handset," "access terminal," "subscriber device," "subscriber terminal," "subscriber station," "terminal," and variants thereof may interchangeably refer to any suitable mobile or stationary device that can receive wireless communication and/or navigation signals. These terms include, but are not limited to, a music player, a video player, an entertainment unit, a navigation device, a communications device, a smartphone, a personal digital assistant, a fixed location terminal, a tablet computer, a computer, a wearable device, a laptop computer, a server, an automotive device in an automotive vehicle, and/or other types of portable electronic devices typically carried by a person and/or having communication capabilities (e.g., wireless, cellular, infrared, short-range radio, etc.). These terms are also intended to include devices which communicate with another device that can receive wireless communication and/or navigation signals such as by short-range wireless, infrared, wireline connection, or other connection, regardless of whether satellite signal reception, assistance data reception, and/or position-related processing occurs at the device or at the other device. In addition, these terms are intended to include all devices, including wireless and wireline communication devices, that are able to communicate with a core network via a radio access network (RAN), and through the core network the UEs can be connected with external networks such as the Internet and with other UEs. Of course, other mechanisms of connecting to the core network and/or the Internet are also possible for the UEs, such as over a wired access network, a wireless local area network (WLAN) (e.g., based on IEEE 802.11, etc.) and so on. UEs can be embodied by any of a number of types of devices including but not limited to printed circuit (PC) cards, compact flash devices, external or internal modems, wireless or wireline phones, smartphones, tablets, tracking devices, asset tags, and so on.

The wireless communication between electronic devices can be based on different technologies, such as code division multiple access (CDMA), W-CDMA, time division multiple access (TDMA), frequency division multiple access (FDMA), Orthogonal Frequency Division Multiplexing (OFDM), Global System for Mobile Communications (GSM), 3GPP Long Term Evolution (LTE), 5G New Radio, Bluetooth (BT), Bluetooth Low Energy (BLE), IEEE 802.11 (WiFi), and IEEE 802.15.4 (Zigbee/Thread) or other protocols that may be used in a wireless communications network or a data communications network.

The word "exemplary" is used herein to mean "serving as an example, instance, or illustration." Any details described herein as "exemplary" is not to be construed as advantageous over other examples. Likewise, the term "examples" does not mean that all examples include the discussed feature, advantage, or mode of operation. Furthermore, a particular feature and/or structure can be combined with one or more other features and/or structures. Moreover, at least a portion of the apparatus described herein can be configured to perform at least a portion of a method described herein.

It should be noted that the terms "connected," "coupled," or any variant thereof, mean any connection or coupling, either direct or indirect, between elements, and can encompass a presence of an intermediate element between two elements that are "connected" or "coupled" together via the intermediate element unless the connection is expressly disclosed as being directly connected.

Any reference herein to an element using a designation such as "first," "second," and so forth does not limit the quantity and/or order of those elements. Rather, these designations are used as a convenient method of distinguishing between two or more elements and/or instances of an element. Also, unless stated otherwise, a set of elements can comprise one or more elements.

In the detailed description above it can be seen that different features are grouped together in examples. This manner of disclosure should not be understood as an intention that the example clauses have more features than are explicitly mentioned in each clause. Rather, the various aspects of the disclosure may include fewer than all features of an individual example clause disclosed. Therefore, the following clauses should be deemed to be incorporated in the description, wherein each clause by itself can stand as a separate example. Although each dependent clause can refer in the clauses to a specific combination with one of the other clauses, the aspect(s) of that dependent clause are not limited to the specific combination. It will be appreciated that other example clauses can also include a combination of the dependent clause aspect(s) with the subject matter of any other dependent clause or independent clause or a combination of any feature with other dependent and independent clauses. The various aspects disclosed herein expressly include these combinations, unless it is explicitly expressed or can be readily inferred that a specific combination is not intended (e.g., contradictory aspects, such as defining an element as both an insulator and a conductor). Furthermore, it is also intended that aspects of a clause can be included in any other independent clause, even if the clause is not directly dependent on the independent clause.

Implementation examples are described in the following numbered clauses:

Clause 1. An apparatus including a spiral inductor comprising: a plurality of dielectric layers formed on a substrate; a plurality of conductive layers, each of the plurality of conductive layers disposed on each of the plurality of dielectric layers; a plurality of insulating layers, each of the plurality of insulating layers disposed on each of the plurality of conductive layers and configured to separate each of the plurality of dielectric layers; a plurality of vias; and a first spiral coil arranged in a first plane perpendicular to the substrate, wherein the first spiral coil is formed of first portions of the plurality of conductive layers and a first set of vias of the plurality of vias, configured to connect the first portions of the plurality of conductive layers.

Clause 2. The apparatus of clause 1, further comprising: a second spiral coil arranged in a second plane perpendicular to the substrate, wherein the second spiral coil is formed of second portions of the plurality of conductive layers and a second set of vias of the plurality of vias, configured to connect the second portions of the plurality of conductive layers.

Clause 3. The apparatus of clause 2, wherein the first spiral coil is electrically coupled to the second spiral coil.

Clause 4. The apparatus of any of clauses 2 to 3, wherein the first spiral coil and the second spiral coil are coupled in series.

Clause 5. The apparatus of any of clauses 2 to 3, wherein the first spiral coil and the second spiral coil are coupled in parallel.

Clause 6. The apparatus of any of clauses 2 to 5, wherein the first spiral coil is magnetically coupled to the second spiral coil.

Clause 7. The apparatus of clause 6, wherein the first spiral coil and the second spiral coil are arranged in a transformer configuration and include at least one input tap and one output tap.

Clause 8. The apparatus of any of clauses 2 to 7, further comprising: a third spiral coil arranged in a third plane perpendicular to the substrate, wherein the third spiral coil is formed of third portions of the plurality of conductive layers and a third set of vias of the plurality of vias, configured to connect the third portions of the plurality of conductive layers.

Clause 9. The apparatus of clause 8, wherein the third spiral coil and the second spiral coil are magnetically coupled to each other and wherein the first spiral coil and the third spiral coil are electrically coupled to each other.

Clause 10. The apparatus of any of clauses 8 to 9, wherein the first spiral coil, the second spiral coil, and the third spiral coil are electrically coupled.

Clause 11. The apparatus of clause 10, wherein the first spiral coil, the second spiral coil, and the third spiral coil are coupled in series.

Clause 12. The apparatus of clause 10, wherein the first spiral coil, the second spiral coil, and the third spiral coil are coupled in parallel.

Clause 13. The apparatus of any of clauses 2 to 12, wherein the first spiral coil and the second spiral coil are arranged on a same plane in a nested coil configuration.

Clause 14. The apparatus of clause 13, wherein the first spiral coil is magnetically coupled to the second spiral coil in a transformer configuration.

Clause 15. The apparatus of any of clauses 13 to 14, wherein the first spiral coil is electrically coupled to the second spiral coil.

Clause 16. The apparatus of any of clauses 1 to 15, wherein the substrate comprises at least one of an active component, a passive component, or metal routings located under the first spiral coil.

Clause 17. The apparatus of any of clauses 1 to 16, wherein the first spiral coil is formed in a back end of line (BEOL) stack.

Clause 18. The apparatus of any of clauses 1 to 17, wherein the apparatus is selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle.

Clause 19. A method for fabricating a spiral inductor, the method comprising: depositing a plurality of dielectric layers on a substrate; depositing a plurality of conductive layers, each of the plurality of conductive layers disposed on each of the plurality of dielectric layers; depositing a plurality of insulating layers, each of the plurality of insulating layers disposed on each of the plurality of conductive layers, wherein each of the plurality of insulating layers separates each of the plurality of dielectric layers; forming a plurality of vias; and forming a first spiral coil in a first plane perpendicular to the substrate, wherein the first spiral coil is formed of first portions of the plurality of conductive layers and a first set of vias of the plurality of vias, configured to connect the first portions of the plurality of conductive layers.

Clause 20. The method of clause 19, further comprising: forming a second spiral coil in a second plane perpendicular to the substrate, wherein the second spiral coil is formed of second portions of the plurality of conductive layers and a second set of vias of the plurality of vias, configured to connect the second portions of the plurality of conductive layers.

Clause 21. The method of clause 20, further comprising: electrically coupling the first spiral coil to the second spiral coil.

Clause 22. The method of clause 20 to 21, further comprising: electrically coupling the first spiral coil and the second spiral coil in series.

Clause 23. The method of any of clauses 20 to 21, further comprising: electrically coupling the first spiral coil and the second spiral coil in parallel.

Clause 24. The method of any of clauses 20 to 23, wherein the first spiral coil is magnetically coupled to the second spiral coil.

Clause 25. The method of any of clauses 20 to 24, further comprising: forming a third spiral coil in a third plane perpendicular to the substrate, wherein the third spiral coil is formed of third portions of the plurality of conductive layers and a third set of vias of the plurality of vias, configured to connect the third portions of the plurality of conductive layers.

Clause 26. The method of clause 25, wherein the third spiral coil is magnetically coupled to the second spiral coil and wherein the first spiral coil and the third spiral coil are electrically coupled to each other.

Clause 27. The method of any of clauses 25 to 26, wherein the first spiral coil, the second spiral coil, and the third spiral coil are arranged in a transformer configuration and include at least one input tap and one output tap.

Clause 28. The method of any of clauses 25 to 27, further comprising: electrically coupling the first spiral coil, the second spiral coil, and the third spiral coil.

Clause 29. The method of clause 28, further comprising: electrically coupling the first spiral coil, the second spiral coil, and the third spiral coil in series.

Clause 30. The method of clause 28, further comprising: electrically coupling the first spiral coil, the second spiral coil, and the third spiral coil in parallel.

Clause 31. The method of any of clauses 20 to 30, wherein the first spiral coil and the second spiral coil are arranged on a same plane in a nested coil configuration.

Clause 32. The method of clause 31, wherein the first spiral coil is magnetically coupled to the second spiral coil in a transformer configuration.

Clause 33. The method of any of clauses 31 to 32, further comprising: electrically coupling the first spiral coil to the second spiral coil.

Clause 34. The method of any of clauses 19 to 33, wherein the substrate comprises at least one of an active component, a passive component, or metal routings located under the first spiral coil.

Clause 35. The method of any of clauses 19 to 34, wherein the first spiral coil is formed in a back end of line (BEOL) stack.

Clause 36. The method of any of clauses 19 to 35, wherein the spiral inductor is integrated into an apparatus and wherein the apparatus is selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle.

Those skilled in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Nothing stated or illustrated depicted in this application is intended to dedicate any component, action, feature, benefit, advantage, or equivalent to the public, regardless of whether the component, action, feature, benefit, advantage, or the equivalent is recited in the claims.

Further, those of skill in the art will appreciate that the various illustrative logical blocks, modules, circuits, and algorithm actions described in connection with the examples disclosed herein may be implemented as electronic hardware, computer software, or combinations of both. To clearly illustrate this interchangeability of hardware and software, various illustrative components, blocks, modules, circuits, and actions have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

Although some aspects have been described in connection with a device, it goes without saying that these aspects also constitute a description of the corresponding method, and so a block or a component of a device should also be understood as a corresponding method action or as a feature of a method action. Analogously thereto, aspects described in connection with or as a method action also constitute a description of a corresponding block or detail or feature of a corresponding device. Some or all of the method actions can be performed by a hardware apparatus (or using a hardware apparatus), such as, for example, a microprocessor, a programmable computer, or an electronic circuit. In some examples, some or a plurality of the most important method actions can be performed by such an apparatus.

In the detailed description above it can be seen that different features are grouped together in examples. This manner of disclosure should not be understood as an intention that the claimed examples have more features than are explicitly mentioned in the respective claim. Rather, the disclosure may include fewer than all features of an individual example disclosed. Therefore, the following claims should be deemed to be incorporated in the description, wherein each claim by itself can stand as a separate example. Although each claim by itself can stand as a separate example, it should be noted that—although a dependent claim can refer in the claims to a specific combination with one or a plurality of claims—other examples can also encompass or include a combination of said dependent claim with the subject matter of any other dependent claim or a combination of any feature with other dependent and independent claims. Such combinations are proposed herein, unless it is explicitly expressed that a specific combination is not intended. Furthermore, it is also intended that features of a claim can be included in any other independent claim, even if said claim is not directly dependent on the independent claim.

It should furthermore be noted that methods, systems, and apparatus disclosed in the description or in the claims can be implemented by a device comprising means for performing the respective actions and/or functionalities of the methods disclosed.

Furthermore, in some examples, an individual action can be subdivided into a plurality of sub-actions or contain a plurality of sub-actions. Such sub-actions can be contained in the disclosure of the individual action and be part of the disclosure of the individual action.

While the foregoing disclosure shows illustrative examples of the disclosure, it should be noted that various changes and modifications could be made herein without departing from the scope of the disclosure as defined by the appended claims. The functions and/or actions of the method claims in accordance with the examples of the disclosure described herein need not be performed in any particular order. Additionally, well-known elements will not be described in detail or may be omitted so as to not obscure the relevant details of the aspects and examples disclosed herein. Furthermore, although elements of the disclosure may be described or claimed in the singular, the plural is contemplated unless limitation to the singular is explicitly stated.

What is claimed is:

1. An apparatus including a spiral inductor an inductive device, comprising:
   a plurality of dielectric layers formed on a substrate;
   a plurality of conductive layers, each of the plurality of conductive layers disposed on each of the plurality of dielectric layers;
   a plurality of insulating layers, each of the plurality of insulating layers disposed to separate corresponding two adjacent dielectric layers of the plurality of dielectric layers;
   a plurality of vias;
   a first spiral coil arranged in a first plane perpendicular to the substrate, wherein the first spiral coil is formed of first portions of the plurality of conductive layers and a first set of vias of the plurality of vias, configured to connect the first portions of the plurality of conductive layers; and
   a second spiral coil arranged in the first plane, wherein the second spiral coil is formed of second portions of the plurality of conductive layers and a second set of vias of the plurality of vias, configured to connect the second portions of the plurality of conductive layers,
   wherein the first spiral coil and the second spiral coil are arranged in a nested configuration.

2. The apparatus of claim 1, wherein the first spiral coil is electrically coupled to the second spiral coil.

3. The apparatus of claim 2, wherein the first spiral coil and the second spiral coil are coupled in series.

4. The apparatus of claim 2, wherein the first spiral coil and the second spiral coil are coupled in parallel.

5. The apparatus of claim 1, wherein the first spiral coil is magnetically coupled to the second spiral coil.

6. The apparatus of claim 5, wherein the first spiral coil and the second spiral coil are arranged in a transformer configuration and include at least one input tap and one output tap.

7. The apparatus of claim 1, further comprising:
   a third spiral coil arranged in a second plane perpendicular to the substrate, wherein the third spiral coil is formed of third portions of the plurality of conductive layers and a third set of vias of the plurality of vias, configured to connect the third portions of the plurality of conductive layers.

8. The apparatus of claim 7, wherein the third spiral coil and the second spiral coil are magnetically coupled to each other and wherein the first spiral coil and the third spiral coil are electrically coupled to each other.

9. The apparatus of claim 7, wherein the first spiral coil, the second spiral coil, and the third spiral coil are electrically coupled.

10. The apparatus of claim 9, wherein the first spiral coil, the second spiral coil, and the third spiral coil are coupled in series.

11. The apparatus of claim 9, wherein the first spiral coil, the second spiral coil, and the third spiral coil are coupled in parallel.

12. The apparatus of claim 1, wherein the first spiral coil is magnetically coupled to the second spiral coil in a transformer configuration.

13. The apparatus of claim 1, wherein the substrate comprises at least one of an active component, a passive component, or metal routings located under the first spiral coil.

14. The apparatus of claim 1, wherein the first spiral coil is formed in a back end of line (BEOL) stack.

15. The apparatus of claim 1, wherein the apparatus is selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle.

* * * * *